United States Patent
Unno

(10) Patent No.: US 7,968,903 B2
(45) Date of Patent: Jun. 28, 2011

(54) LIGHT EMITTING DEVICE

(75) Inventor: Tsunehiro Unno, Hitachi (JP)

(73) Assignee: Hitachi Cable, Ltd., Chiyoda-Ku, Tokyo (JP)

( * ) Notice: Subject to any disclaimer, the term of this patent is extended or adjusted under 35 U.S.C. 154(b) by 180 days.

(21) Appl. No.: 12/382,598

(22) Filed: Mar. 19, 2009

(65) Prior Publication Data

US 2010/0065867 A1  Mar. 18, 2010

(30) Foreign Application Priority Data

Sep. 12, 2008 (JP) ................................ 2008-234748

(51) Int. Cl.
*H01L 33/00* (2010.01)
(52) U.S. Cl. .................. 257/99; 257/E33.062
(58) Field of Classification Search .................. 257/99, 257/98, E33.062, E33.065, E33.066, E33.068
See application file for complete search history.

(56) References Cited

U.S. PATENT DOCUMENTS 7,714,343 B2 * 5/2010 Unno et al. ...................... 257/98
2006/0043399 A1 3/2006 Miyagaki et al.

FOREIGN PATENT DOCUMENTS

JP 2006-66449 3/2006

* cited by examiner

*Primary Examiner* — Mark Prenty
(74) *Attorney, Agent, or Firm* — McGinn IP Law, PLLC

(57) ABSTRACT

A light emitting device has a semiconductor multilayer structure having a first semiconductor layer of a first conductivity type, a second semiconductor layer of a second conductivity type different from the first conductivity type, and an active layer sandwiched between the first semiconductor layer and the second semiconductor layer, a narrow electrode having a current feeding part provided on a region of a part above of the first semiconductor layer for supplying an electric current from outside to the semiconductor multilayer structure, and a narrow electrode provided adjacent to the current feeding part for reflecting a light emitted from the active layer, and a surface center electrode part electrically connected to the narrow electrode, and provided above the first semiconductor layer via a transmitting layer for transmitting the light.

9 Claims, 24 Drawing Sheets

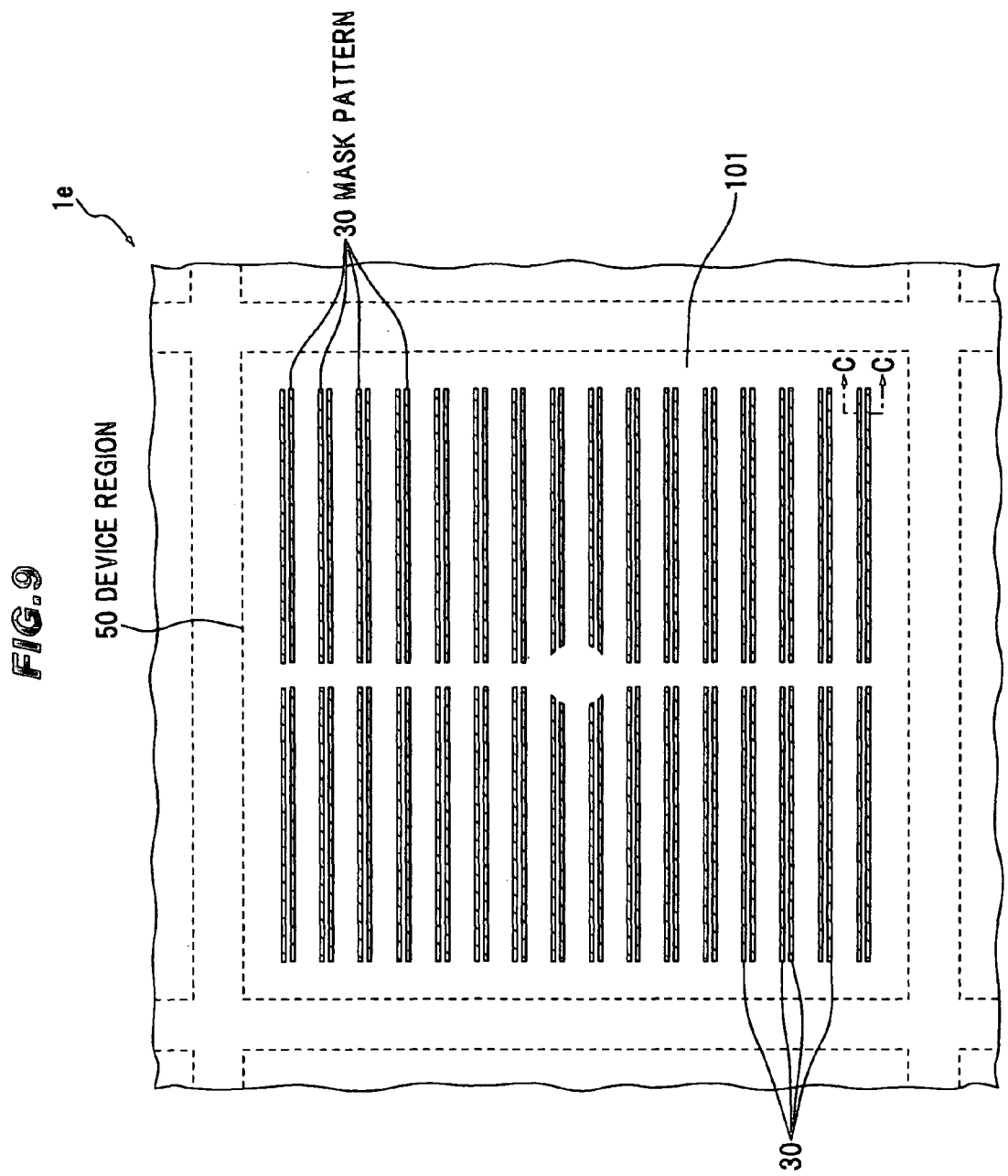

LIGHT EMITTING DEVICE

The present application is based on Japanese Patent Application No. 2008-234748 filed on Sep. 12, 2008, the entire contents of which are incorporated herein by reference.

BACKGROUND OF THE INVENTION

1. Field of the Invention

The present invention relates to a light emitting device, in more particular, to a light emitting device with high luminescence for a large current.

2. Related Art

In order to realize a light emitting diode (LED) with high luminescence, it is required to realize a structure which can supply a large current as well as enhancement of light emitting efficiency. As to the LED to which a large current of ampere order is supplied, a chip size is large. Therefore, narrow electrodes are often formed at a surface of the LED for the purpose of uniformly supplying the current to overall of the chip.

As a conventional light emitting device, a light emitting device comprising a substrate, a light emitting layer provided on the substrate, an electrode provided on the light emitting layer, and a contact layer selectively provided between the light emitting layer and the electrode, in which a narrow electrode is connected to the electrode provided on the light emitting layer has been known. Japanese Patent Laid-Open No. 2006-66449 (JP-A 2006-66449) discloses such a conventional light emitting device.

However, in the conventional light emitting device such as the light emitting device disclosed in JP-A 2006-66449, there is a disadvantage in that the narrow electrode may be burn out by the heat due to a small cross section of the narrow electrode when the large current is supplied. On the other hand, when a width of the narrow electrode is increased so as to prevent the narrow electrode from burnout, there is another disadvantage in that the light is absorbed by an ohmic contact part between the narrow electrode and the semiconductor, thereby reducing the light emitting efficiency.

SUMMARY OF THE INVENTION

Accordingly, the object of the present invention is to provide a light emitting device with high luminescence for the large current.

According to a feature of the invention, a light emitting device comprises:

a semiconductor multilayer structure having a first semiconductor layer of a first conductivity type, a second semiconductor layer of a second conductivity type different from the first conductivity type, and an active layer sandwiched between the first semiconductor layer and the second semiconductor layer;

a narrow electrode having a current feeding part provided on a region of a part above of the first semiconductor layer for supplying an electric current from outside to the semiconductor multilayer structure, and a light reflecting part provided adjacent to the current feeding part for reflecting a light emitted from the active layer; and a surface center electrode part electrically connected to the narrow electrode, and provided above the first semiconductor layer via a transmitting layer for transmitting the light 2.

In the light emitting device, the surface center electrode part may reflect the light at an interface between the transmitting layer and the surface center electrode part.

In the light emitting device, the current feeding part may comprise a metal layer in ohmic-contact with a part of the semiconductor multilayer structure, and a narrow electrode metal layer provided on the metal layer at an opposite side of a part of the semiconductor multilayer structure.

In the light emitting device, the light reflecting part may comprise a transmitting part having a resistivity higher than a resistivity of the current feeding part and the narrow electrode metal layer, and the light reflecting part reflects the light emitted from the active layer at an interface between the transmitting part and the narrow electrode metal layer.

The light emitting device may further comprise:

a supporting substrate having a reflecting layer for reflecting the light emitted from the active layer;

a transparent layer provided between the reflecting layer and the semiconductor multilayer structure; and a contact part provided by filling a region passing through a part of the transparent layer, wherein the semiconductor multilayer structure is supported by the supporting substrate via the transparent layer, wherein the contact part electrically connects the semiconductor multilayer structure with the reflecting layer.

In the light emitting device, the surface center electrode part may comprise a pad to which a wire is connected, and a liner electrode connected to the pad and extending along a horizontal direction of the active layer, and the liner electrode has a width greater than a width of the narrow electrode.

In the light emitting device, the transmitting layer and the transmitting part may comprise an insulating material for transmitting the light.

In the light emitting device, the transmitting layer and the transmitting part may comprise a conductive material for transmitting the light.

In the light emitting device, the transmitting layer and the transmitting part may comprise a semiconductor material for transmitting the light.

Advantages of the Invention

According to the present invention, it is possible to provide a light emitting device with high luminescence for the large current.

BRIEF DESCRIPTION OF THE DRAWINGS

Next, the light emitting device in preferred embodiments according to the invention will be explained in conjunction with appended drawings, wherein:

FIGS. 4 to 21 are diagrams showing a process for fabricating the light emitting device in the first preferred embodiment, wherein FIG. 10 is a cross sectional view along C-C line of the light emitting device shown in FIG. 9, FIG. 13 is a cross sectional view along D-D line of the light emitting device shown in FIG. 12, FIG. 15 is a cross sectional view along E-E line of the light emitting device shown in FIG. 14, and FIG. 16 is a cross sectional view along F-F line of the light emitting device shown in FIG. 14;

DETAILED DESCRIPTION OF THE PREFERRED EMBODIMENTS

Next, the preferred embodiments according to the present invention will be explained in more detail in conjunction with the appended drawings.

The First Preferred Embodiment

Figure 1:
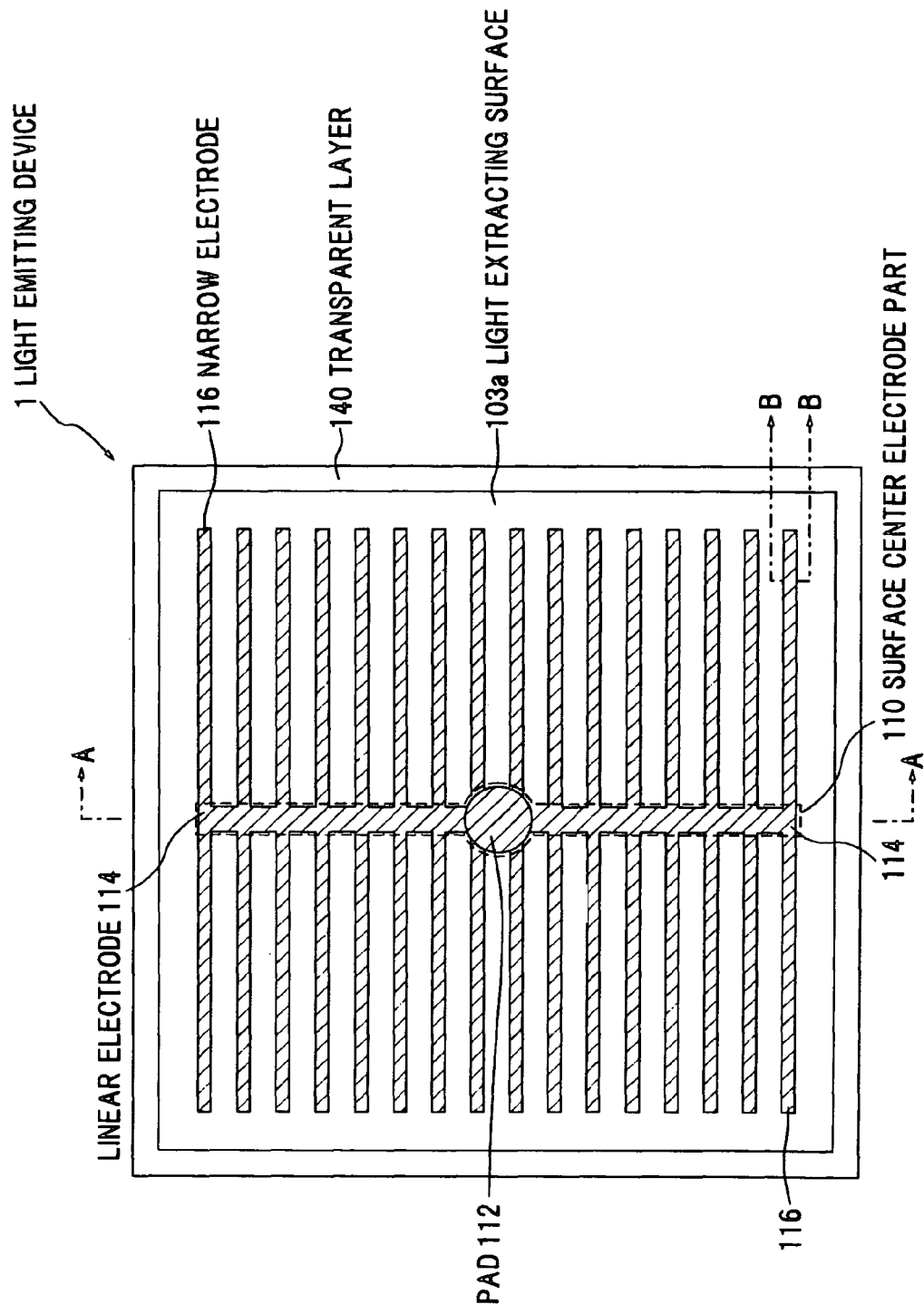
FIG. 1 is a schematic plan view of a light emitting device in a first preferred embodiment according to the invention.
Figure 2:
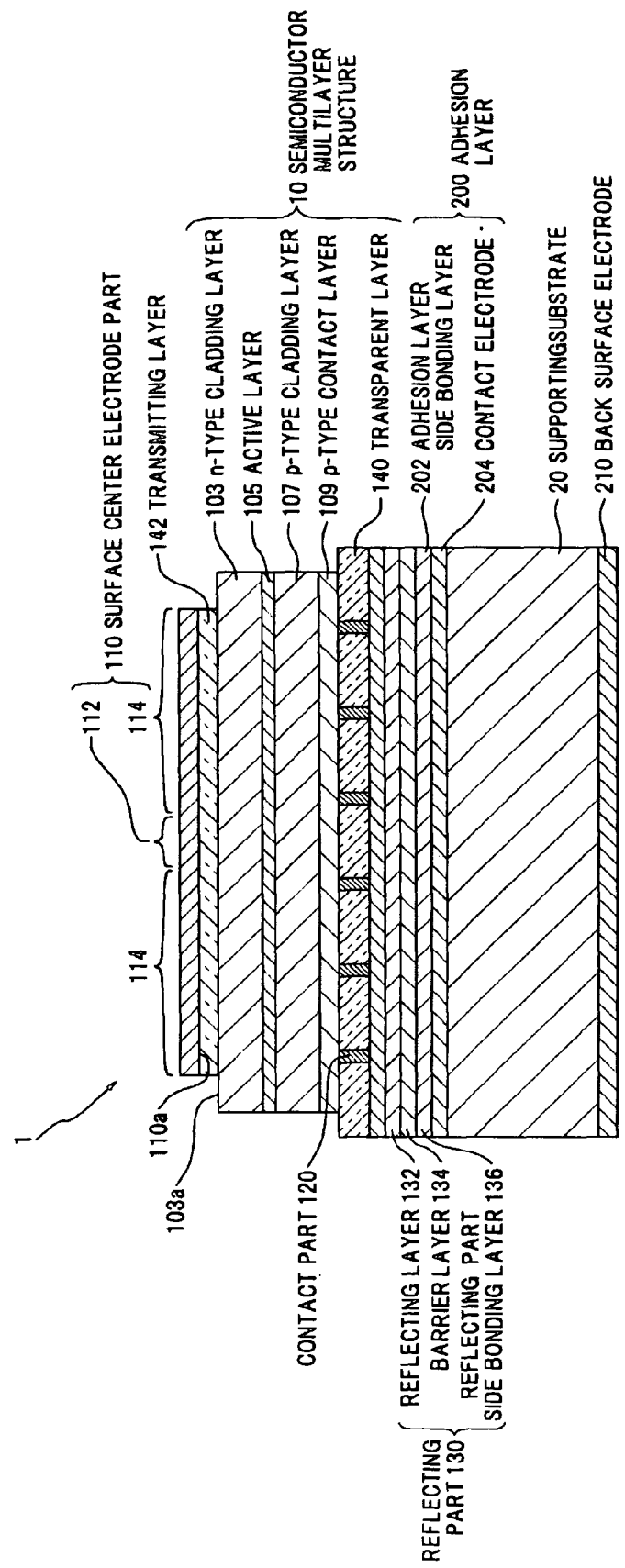
FIG. 2 is a schematic longitudinal sectional view along A-A line of the light emitting device shown in FIG. 1.
Figure 3:
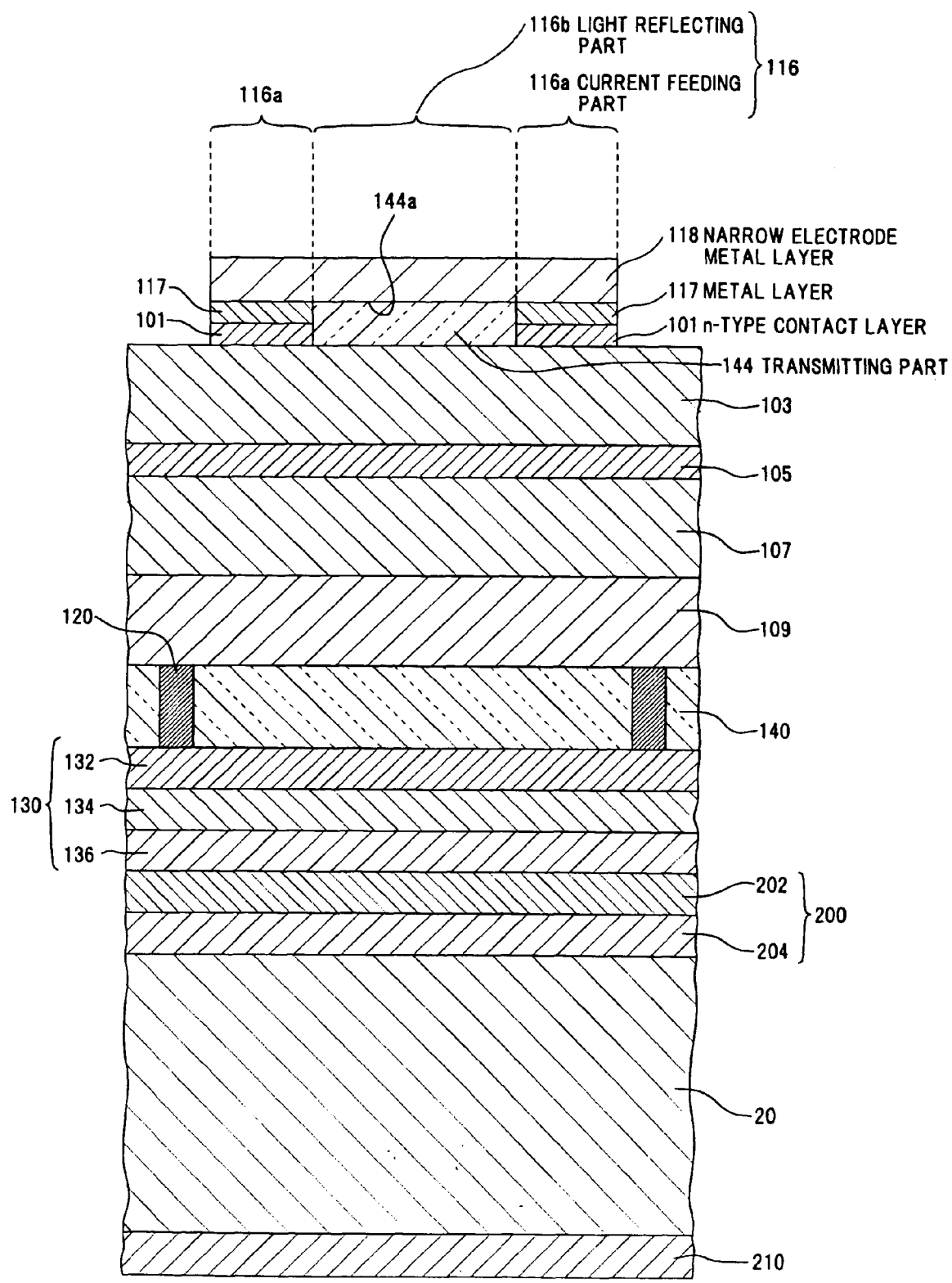
FIG. 3 is a partial longitudinal sectional view of the light emitting device along B-B line of the light emitting device shown in FIG. 1.

FIG. 1 is a schematic plan view of a light emitting device in a first preferred embodiment according to the invention, FIG. 2 is a schematic longitudinal sectional view along A-A line of the light emitting device shown in FIG. 1, and FIG. 3 is a partial longitudinal sectional view of the light emitting device along B-B line of the light emitting device shown in FIG. 1. In more concrete, FIG. 2 is a schematic longitudinal sectional view along A-A line of the light emitting device 1 shown in FIG. 1, and FIG. 3 is a partial longitudinal sectional view of the light emitting device along B-B line of the light emitting device 1 shown in FIG. 1.
(Outline of a Structure of the Light Emitting Device 1)

With referring to FIG. 1, the light emitting device 1 in the first preferred embodiment is formed to have a substantially square shape in its top plan view. As an example, the light emitting device 1 is a (large current-compliant type) light emitting diode (LED) adapted for a large current supply, with a thickness of about 200 μm and a chip size of 2 mm×2 mm in the top plan view. A large current of ampere class, e.g. 1A or more is supplied to the light emitting device 1.

The light emitting device 1 comprises a light extracting surface 103a through which the light emitted from the light emitting device 1 is taken out to the outside of the light emitting device 1, a surface center electrode part 110 provided on the light extracting surface 103a, and having a pad 112 to which a wire is connected and a linear electrode 114 extending toward an outer periphery of the light emitting device from the pad 112, and a plurality of narrow electrodes 116 electrically connected to the surface center electrode part 110.

At first, with referring to FIGS. 2 and 3, the outline of the structure of the light emitting device 1 will be explained below.

The light emitting device 1 comprises a semiconductor multilayer structure 10 having an active layer 105 which emits a light with a predetermined wavelength, a plurality of narrow electrodes 116 electrically connected to a region of a part of a surface of the semiconductor multilayer structure 10, a contact part 120 being in ohmic-contact with a part of another surface of the semiconductor multilayer structure 10, a transparent layer 140 provided to contact with another surface of the semiconductor multilayer structure 10 except a region where the contact part 120 is provided, and a reflecting part 130 provided on a surface of the contact part 120 and the transparent layer 140 at an opposite side with respect to another surface contacting with the semiconductor multilayer structure 10.

With referring to FIG. 2, the pad 112 and the linear electrode 114 are provided on the semiconductor multilayer structure 10, via a transmitting layer 142 which transmits the light emitted from the active layer 105. Herein, the transmitting layer 142 comprises a material having a higher resistivity than that of the pad 112 and the linear electrode 114 provided on the transmitting layer 142. As an example, the transmitting layer 142 may comprise a substantially electrical insulating material.

With referring to FIG. 3, the narrow electrodes 116 are provided on the semiconductor multilayer structure 10, via a metal layer 117 which is in ohmic-contact with the region of the part of the one surface of the semiconductor multilayer structure 10.

Further, with referring to FIG. 2, the light emitting device 1 further comprises an adhesion layer 200 having an electrical conductivity and provided on a surface of the reflecting part 130 at an opposite side with respect to another surface contacting with the contact part 120 and the transparent layer 140, and a supporting substrate 20 having an electrical conductivity and provided on a surface of the adhesion layer 200 at an opposite side with respect to another surface contacting with the reflecting part 130. The supporting substrate 20 has a back surface electrode 210 on a surface at an opposite side with respect to another surface contacting with the adhesion layer 200 (i.e. a back surface of the supporting substrate 20).

In addition, the semiconductor multilayer structure 10 in the light emitting device 1 in the first preferred embodiment comprises a p-type contact layer 109 provided in contact with the contact part 120 and the transparent layer 140, a p-type cladding layer 107 provided as a second semiconductor layer with a second conductivity type on a surface of the p-type contact layer 109 at an opposite side with respect to another surface contacting with the transparent layer 140, the active layer 105 provided on a surface of the p-type cladding layer 107 at an opposite side with respect to another surface contacting with the p-type contact layer 109, an n-type cladding layer 103 provided as a first conductivity type first semiconductor layer provided on a surface of the active layer 105 at an opposite side with respect to another surface contacting with the p-type cladding layer 107, and an n-type contact layer 101 provided on a region of a surface of the n-type cladding layer 103 at an opposite side with respect to another surface contacting with the active layer 105. Herein, the n-type contact layer 101 is provided at a part of a region right under the narrow electrodes 116.

The surface of the semiconductor multilayer structure 10 at the opposite side with respect to another surface contacting with the transparent layer 140 is the light extracting surface 103a of the light emitting device 1 in the first preferred embodiment. In concrete, a part of the n-type cladding layer 103 at an opposite side with respect to another surface contacting with the active layer 105 (namely, a part except a region right under the surface center electrode part 110 and the narrow electrodes 116) is provided as the light extracting surface 103a. A convexo-concave portion of micron order may be formed on the light extracting surface 103a for the purpose of improving the light extracting efficiency. The convexo-concave portion may be formed with regularity such as a matrix shape and honeycomb shape on the light extracting surface 103. Alternatively, the convexo-concave portion may be formed with irregularity on the light extracting surface 103a. A part of the light reflected by the light extracting surface 103a is converted into the heat in process of returning to a side of the active layer 105. Therefore, it is possible to reduce the heat generated from the part of the light reflected to the active layer 105 side by providing the convexo-concave portion.

Further, the reflecting part 130 comprises a reflecting layer 132 provided in contact with the contact part 120 and the transparent layer 140, a barrier layer 134 provided on a surface of the reflecting layer 132 at an opposite side with respect to another surface contacting with the contact part 120 and the transparent layer 140, and a bonding layer 136 provided on a surface of the barrier layer 134 at an opposite side with respect to another surface contacting with the reflecting layer 132.

The adhesion layer 200 comprises a bonding layer 202 electrically and mechanically bonded to the bonding layer 136 of the reflecting part 130, and a contact electrode 204 provided on a surface of the bonding layer 202 at an opposite side with respect to another surface contacting with the reflecting layer 130. The back surface electrode 210 is provided at the back surface of the supporting substrate 20 to be in ohmic-contact with the supporting substrate 20.

(Detailed Structure of the Narrow Electrode 116)

With referring to FIG. 3, the narrow electrode 116 in the first preferred embodiment comprises a current feeding part 116a which supplies an electric current from the outside to the semiconductor multilayer structure 10, and a light reflecting part 116b provided adjacent to the current feeding part 116a.

The current feeding part 116a comprises a metal layer 117 provided to be in ohmic-contact with a surface of the n-type contact layer 101 provided on the region of the part above the n-type cladding layer 103, and a part of a narrow electrode metal layer 118 provided on and electrically contacting with a surface of the metal layer 117 at an opposite side with respect to another surface contacting with the n-type contact layer 101.

The light reflecting part 116b comprises a transmitting part 144 provided to be adjacent to the n-type cladding layer 103 in a normal orientation of the surface of the n-type cladding layer 103 and transmitting the light emitted from the active layer 105 therethrough, and another part of the narrow electrode metal layer 118 provided on a surface of the transmitting part 144 at an opposite side with respect to another surface contacting with the n-type cladding layer 103.

The narrow electrode metal layer 118 contacts with the surface of the metal layer 117 and the surface of the transmitting part 144, respectively, and the part contacting with the metal layer 117 and another part contacting with the transmitting part 144 are integrally provided.

In the first preferred embodiment, the n-type contact layer 101 and the metal layer 117 are provided in a narrow linear shape in the top plan view. Each of the narrow electrodes 116 includes two current feeding parts 116a, and the two current feeding parts 116a are facing to each other with respect to the light reflecting part 116b. Each of the current feeding parts 116a comprises the metal layer 117 and the narrow electrode metal layer 118 which electrically contacts with the metal layer 117. The light reflecting part 116b comprises the transmitting part 144, and the narrow electrode metal layer 118 which contacts with the transmitting part 144.

Returning to FIG. 1, a plurality of the narrow electrodes 116 are located substantially parallel to each other in the top plan view of the light emitting device 1. In addition, a width of each of the narrow electrodes 116 in the top plan view is formed to be narrower than a width of the linear electrode 114 in the top plan view. As an example, the width of the linear electrode 114 in the top plan view is formed to be 50 µm, and the width of each of the narrow electrodes 116 in the top plan view is formed to be 10 µm. In addition, a width of each of the n-type contact layer 101 and the metal layer 117 in the top plan view (i.e. a width of the current feeding part 116a) is formed to be 1.5 µm, and a width of the light reflecting part 116b in the top plan view is formed to be about 7 µm.

(Detailed Structure of the Surface Center Electrode Part 110 and the Narrow Electrode 116)

In the first preferred embodiment, the surface center electrode part 110 has such a cross sectional area that the surface center electrode part 110 will not be burnout when the large current of ampere class was supplied thereto. As a result of the experiment, it was observed that the electrode made of Au was damaged when a current supplied to the electrode at a room temperature was $2.5 \times 10^6$ A/cm$^2$ or more.

Returning to FIG. 1, the electric current supplied to the pad 112 is carried through the linear electrode 114 connected to the pad 112. Since the transmitting layer 142 that is substantially insulative is provided right under the pad 112 and the linear electrode 114, the electric current is not directly supplied to the semiconductor multilayer structure 10 from the surface center electrode part 110. The electric current is carried through the narrow electrode 116 electrically connected to the liner electrode 114, and more concretely, through the narrow electrode metal layer 118 electrically connected to the narrow electrode 116 as shown in FIG. 3. Subsequently, this electric current is carried from the narrow electrode metal layer 118 to the metal layer 117 electrically connected to the narrow electrode metal layer 118. Then, the electric current is supplied from the metal layer 117 to the semiconductor multilayer structure 10 including the active layer 105 via the n-type contact layer 101.

Returning to FIG. 2, the pad 112 and the linear electrode 114 of the surface center electrode part 110 are provided on the n-type cladding layer 103 via the transmitting layer 142. The surface center electrode part 110 comprises a metallic material such as Ti, Al, Pt, Au, and Ag, or alternatively a multilayer structure in which a plurality of layers each comprising the metallic material as listed above are laminated. For example, the surface center electrode part 110 may be formed on a surface of the transmitting layer 142 via a thin film adhesion layer (not shown) for improving the adhesion between the transmitting layer 142 and the surface center electrode part 110, namely, the thin film adhesion layer may be provided between the transmitting layer 142 and the surface center electrode part 110. The thin film adhesion layer has such a thickness that does not substantially absorb the light emitted from the active layer 105. The thickness of the thin film adhesion layer is preferably not less than 1 nm and not greater than 5 nm. For example, the thin film adhesion layer may comprise a metallic material such as Ni, Al. The surface center electrode part 110 comprises the metallic material having a high reflectivity with respect to the light emitted from the active layer 105. In the first preferred embodiment, the surface center electrode part 110 may comprise Au having a high reflectivity with respect to the light in a red area, since the active layer 105 emits the red light.

The transmitting layer 142 comprises an electrical insulating material which transmits the light emitted from the active layer 105. In more concrete, the transmitting layer 142 comprises a material which is substantially transparent with respect to the light emitted from the active layer 105 and substantially electrically insulative. As an example, the transmitting layer 142 may comprise a silicon dioxide ($SiO_2$). An interface 110a between the transmitting layer 142 and the pad 112 as well as the linear electrode 114 reflects the light that is emitted from the active layer 105 and incident on the interface 110a back to the side of the active layer 105. In addition, the transmitting part 144 of the narrow electrode 116 may comprise a silicon dioxide ($SiO_2$) having an electrical insulation property and transmitting the light emitted from the active layer 105.

Returning to FIG. 3, the metal layer 117 of the narrow electrode 116 comprises a metallic material which is in ohmic-contact with the n-type contact layer 101. For example, the metal layer 117 may comprise an alloying material including a metallic material of Au, Ge or the like, or alternatively a laminated structure including a layer comprising the alloying material and a layer comprising a metallic material such as Au and Ni. As an example, the metal layer 117 may comprise AuGe/Ni/Au formed in this order from a side of the n-type contact layer 101.

The narrow electrode metal layer 118 may comprise a metallic material such as Ti, Al, Pt, Au, and Ag, or alternatively a multilayer structure in which a plurality of layers each comprising the metallic material as listed above are laminated. For example, the narrow electrode metal layer 118 may comprise Au having the high reflectivity with respect to the light in the red area, since the active layer 105 emits the red light. An interface 144a between the narrow electrode metal layer 118 and the transmitting part 144 reflects the light that is emitted from the active layer 105 and incident on the interface 144a back to the side of the active layer 105.

In addition, the narrow electrode metal layer 118 and the surface center electrode part 110 may comprise the same material. For this case, the narrow electrode metal layer 118 and the surface center electrode part 110 may be formed integrally. In addition, a thin film adhesion layer (not shown) may be provided between the narrow electrode metal layer 118 and the transmitting part 144 for improving the adhesion between the narrow electrode metal layer 118 and the transmitting part 144. This thin film adhesion layer comprises a material similar to the material of the thin film adhesion layer that may be provided between the surface center electrode part 110 and the transmitting layer 142, to have the same function.

In the first preferred embodiment, the surface center electrode part 110 has a principal function to supply the electric current supplied from the outside to the light emitting device 1 toward the narrow electrode 116 as well as a function to reflect back the light emitted from the active layer 105. On the other hand, in the narrow electrode 116, the current feeding part 116a has a function to supply the electric current supplied from the surface center electrode part 110 to the narrow electrode 116 toward the semiconductor multilayer structure 10, and the light reflecting part 116b has a function to reflect back the light emitted from the active layer 105.

(Disposition of the Surface Center Electrode Part 110 and the Narrow Electrode 116)

Returning to FIG. 1, in the first preferred embodiment, the pad 112 of the surface center electrode part 110 is positioned at a substantially center of the light emitting device 1 in the top plan view. The pad 112 is formed in a substantially circular shape, as an example. The linear electrode 114 is formed to extend toward the outer periphery of the light emitting device 1, along a horizontal direction of the surface of the semiconductor multilayer structure 10 (e.g. the active layer 105) from an outer periphery of the pad 112. For example, the linear electrode 114 is a linear electrode with a substantially constant width, which extends from a side of the pad 112 to the outer periphery of the light emitting device 1.

Each of the narrow electrodes 116 is formed to extend in the horizontal direction of the surface of the semiconductor multilayer structure 10 and in a direction substantially vertical to the extending direction of the linear electrode 114. Each of the narrow electrodes 116 is electrically connected to the outer periphery of the linear electrode 114 or the outer periphery of the pad 112. The narrow electrodes 116 are arranged such that one of the narrow electrodes 116 is distant with a substantially constant pitch from an adjacent one of the narrow electrodes 116.

A configuration of the pad 112 in the top plan view is not limited to the circular shape, as long as the pad 112 has such a dimension that a ball formed at a terminal of a wire can be connected to, when the wire comprising Au or the like to be connected to the pad 112 is wire-bonded. For example, the pad 112 may have an elliptical shape, a polygonal shape such as a rectangular shape, and the like in the top plan view.

In the first preferred embodiment, the linear electrode 114 is formed to have a substantially constant width. The linear electrode 114 may be formed to have a tapered shape in which the width is gradually reduced in accordance with a distance from vicinity of the pad 112.

In the first preferred embodiment, the narrow electrode 116 is formed to have a substantially constant width. The narrow electrode 116 may be formed to have a tapered shape in which the width is gradually reduced in accordance with a distance from vicinity of the linear electrode 114.

(Semiconductor Multilayer Structure 10)

With referring to FIGS. 2 and 3, the semiconductor multilayer structure 10 in the first preferred embodiment comprises an AlGaInP based compound semiconductor which is a III-V group compound semiconductor. For example, the semiconductor multilayer structure 10 has a configuration in which the active layer 105 comprising a quantum well structure of an AlGaInP based compound semiconductor is sandwiched between the n-type cladding layer 103 comprising an n-type AlGaInP and the p-type cladding layer 107 comprising a p-type AlGaInP.

The active layer 105 emits the light with the predetermined wavelength when the electric current is supplied form the outside to the active layer 105. For example, the active layer 105 comprises the quantum well structure which emits a red light with a wavelength of around 630 nm. The quantum well structure may comprise a single quantum well structure, a multiquantum well structure or a strain multiquantum well structure.

The n-type cladding layer 103 contains a predetermined concentration of an n-type dopant such as Si and Se. As an example, the n-type cladding layer 103 comprises a Si-doped n-type AlGaInP layer.

The p-type cladding layer 107 contains a predetermined concentration of a p-type dopant such as Zn and Mg. As an example, the p-type cladding layer 107 comprises a Mg-doped p-type AlGaInP layer.

Furthermore, the p-type contact layer 109 of the semiconductor multilayer structure 10 comprises a p-type GaP layer doped with Mg in high concentration, for example.

The n-type contact layer 101 comprises a GaAs layer doped with Si in high concentration, for example. As described above, the n-type contact layer 101 is provided in the region where the metal layer 117 is formed on an upper surface of the n-type cladding layer 103.

(Contact Part 120)

The contact part 120 is provided at a part of the surface of the p-type contact layer 109. The contact part 120 comprises a material which is in ohmic-contact with the p-type contact layer 109, for example, a metal alloy material including Au/Be or Au/Zn. The configuration of the contact part 120 in the top plan view is a configuration by which the electric current supplied from the surface center electrode part 110 to the narrow electrode 116 can be supplied to a substantially entire surface of the active layer 105, e.g. a comb shape. In the first preferred embodiment, the contact part 120 is formed right under the surface center electrode part 110 and the narrow electrodes 116, however, the present invention is not limited thereto. In a variation of the first preferred embodiment, the contact part 120 may be formed at a region except the region right under the surface center electrode part 110 and the narrow electrodes 116.

(Transparent Layer 140)

The transparent layer 140 is provided at a region where the contact part 120 is not provided on the surface of the reflecting part 132 (or the surface of the p-type contact layer 109). The transparent layer 140 comprises a material which transmits a light with the wavelength of the light emitted from the active layer 105, for example, a transparent dielectric layer such as $SiO_2$, $TiO_2$, and $SiN_x$. In addition, the transparent layer 140 has a function as a current blocking layer for blocking the electric current flow in a part where the transparent layer 140 is provided. The electric current supplied to the light emitting device 1 is flown to the semiconductor multilayer structure 10 and the supporting substrate 20 via the contact part 120 without flowing to the transparent layer 140 provided as the current blocking layer.

(Reflecting Part 130)

The reflecting layer 132 of the reflecting part 130 comprises a conductive material having a high reflectivity with respect to the light emitted from the active layer 105. As an example, the reflecting layer 132 comprises a conductive material having a reflectivity of 80% or more with respect to the light emitted from the active layer 105. The reflecting layer 132 reflects the light that is emitted from the active layer 105 and reached the reflecting layer 132 toward the active layer 105. Namely, the reflecting layer 132 reflects the light at an interface between the reflecting layer 132 and the transparent layer 140. For example, the reflecting layer 132 comprises a metallic material such as Al, Au, and Ag, or alternatively an alloy including at least one selected from these metallic materials. As an example, the reflecting layer 132 may comprise Au with a predetermined film thickness. Further, the reflecting layer 130 is electrically connected to the contact part 120.

The barrier layer 134 of the reflecting part 130 comprises a metallic material such as Ti and Pt. As an example, the barrier layer 134 may comprise Ti with a predetermined film thickness. The barrier layer 134 suppresses the material composing the bonding layer 136 from propagating (dispersing) into the reflecting layer 132.

In addition, the bonding layer (reflecting part side bonding layer) 136 comprises a material that is electrically and mechanically bonding to the bonding layer (adhesion layer side bonding layer) 202 of the adhesion layer 200. As an example, the bonding layer 136 may comprise Au with a predetermined film thickness.

(Supporting Substrate 20)

The supporting substrate 20 comprises a material having an electrical conductivity. For example, the supporting substrate 20 may comprise a semiconductor substrate such as p-type or n-type conductive Si substrate, Ge substrate, GaAs substrate, and GaP substrate, or a metal substrate comprising a metallic material such as Cu.

The bonding layer 202 of the adhesion layer 200 may comprise Au with a predetermined thickness, similarly to the bonding layer 136 of the reflecting part 130. In addition, the contact electrode 204 comprises a metallic material that is in ohmic-contact with the supporting substrate 20, such as Ti.

The back surface electrode 210 provided at a back surface of the supporting substrate 20 comprises a metallic material that is in ohmic-contact with the supporting substrate 20 such as Al and Ti.

The light emitting device 1 is mounted on a predetermined position of a stem (not shown) comprising a metallic material such as Cu using a conductive bonding material such as Ag paste or a eutectic material such as AuSn, with turning the back surface of the supporting substrate 20 (namely, an exposed surface of the back surface electrode 210) downward. The pad 112 and a predetermined region of the stem is connected by a wire of Au, and the light emitting device 1 and the total wire are covered with a transparent resin such as epoxy resin and silicone resin, to provide the light emitting device 1 mounted on the stem as a light emitting apparatus.

(Variations)

In the first preferred embodiment, the light emitting device 1 emits the light including red with the wavelength of 630 nm, however, the wavelength of the light emitted from the light emitting device 1 in the present invention is not limited thereto. It is possible to form the light emitting device for emitting a light with a desired wavelength range by controlling the structure of the active layer 105 of the semiconductor multilayer structure 10. As the light emitted from the active layer 105, for example, a light with the wavelength range of orange, yellow, green and the like may be used. The semiconductor multilayer structure 10 of the light emitting device 1 may comprise a GaN based compound semiconductor including the active layer 105 which emits the light in an ultraviolet region, purple region or blue region. Further, the semiconductor multilayer structure 10 of the light emitting device 1 may comprise an AlGaAs based compound semiconductor including the active layer 105 which emits the light in an infrared region.

The surface center electrode part 110 and the narrow electrode metal layer 118 may comprise a material having a high reflectivity with respect to the light emitted from the active layer 105, in accordance with the wavelength of the light emitted from the active layer 105. For example, the surface center electrode part 110 and the narrow electrode metal layer 118 may comprise Al or Ag for the case that the light emitted from the active layer 105 is the light in the blue region.

Further, a region for connecting the surface center electrode part 110 and the semiconductor multilayer structure 10 (e.g. n-type cladding layer 103) may be formed at a part of the transmitting layer 142 right under the surface center electrode part 110.

Each of the transmitting layer 142 and the transmitting part 144 may comprise a material other than $SiO_2$. For example, each of the transmitting layer 142 and the transmitting part 144 may comprise a transparent material having an electrical conductivity as well as transmitting the light emitted from the active layer 105, such as titanium oxide ($TiO_2$), silicon nitride ($SiN_x$), magnesium fluoride (MgF), and phosphorus-doped spin-on glass (PSG). Further, each of the transmitting layer 142 and the transmitting part 144 may comprise a transparent conductive material having a high resistivity than those of the surface center electrode part 110, the narrow electrode metal layer 118, and the metal layer 117. As the transparent conductive material, ITO, tin oxide, ZnO or the like may be used, for example.

Even through the transmitting layer 142 comprises the transparent conductive material, the resistivity of the transmitting layer 142 is higher than the resistivity of the surface center electrode part 110, so that the current supplied to the surface center electrode part 110 is supplied to the narrow electrode 116 mainly through the linear electrode 114. Therefore, the electric current is not supplied from the transmitting layer 142 comprising the transparent conductive material to the semiconductor multilayer structure 10. Alternatively, when the transmitting layer 142 and the transmitting part 144 comprise the transparent conductive material, the electric current supplied to the surface center electrode part 110 is dispersed into the transmitting layer 142 and the transmitting part 144.

Further, the transmitting layer 142 and the transmitting part 144 may comprise a semiconductor material transmitting the light emitted from the active layer 105. For example, the transmitting layer 142 and the transmitting part 144 may comprise a wide bandgap semiconductor material that is transparent with respect to the light in the red region, such as ZnSe and ZnS, for the case that light emitted from the active layer 105 is the light in the red region. When the transmitting layer 142 and the transmitting part 144 comprise a semiconductor, this semiconductor may be either of single crystal or a polycrystal, as long as the semiconductor is substantially transparent with respect to the light emitted from the active layer 105. In addition, when ZnS is adopted as the semiconductor composing the transmitting layer 142 and the transmitting part 144, the transmitting layer 142 and the transmitting part 144 may be formed by solution method.

Figure 24A:
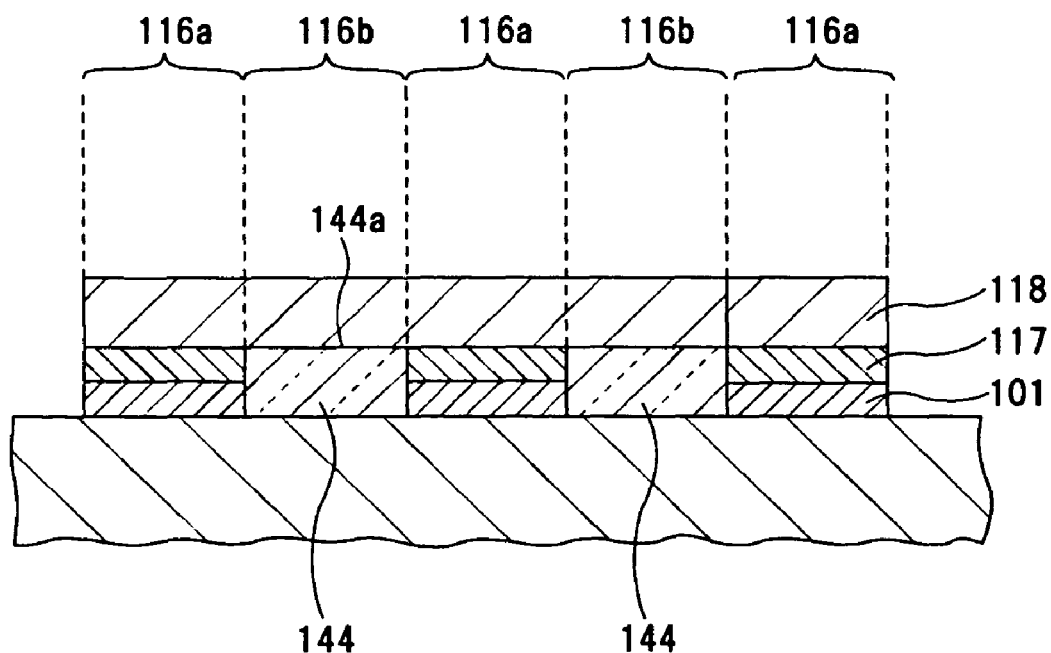
FIGS. 24A and 24B are explanatory diagrams showing variations of a narrow electrode in the first preferred embodiment.
Figure 24B:
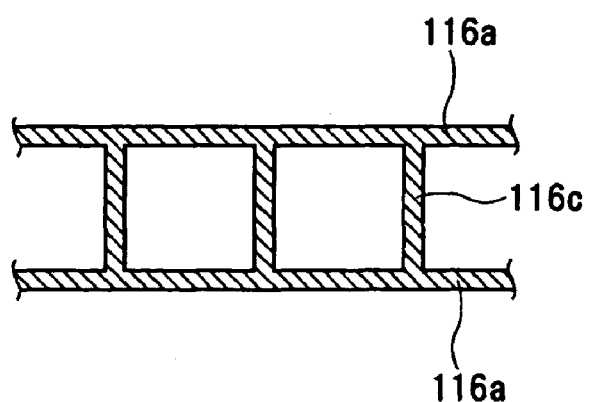

FIG. 24A and FIG. 24B are explanatory diagrams showing variation of the configuration of the narrow electrode 116.

As shown in FIG. 24A, the narrow electrode 116 may comprise a plurality of the current feeding parts 116a. For example, the narrow electrode 116 may comprise three current feeding parts 116a, and two light reflecting parts 116b provided at two regions sandwiched by the three current feeding parts 116a.

As shown in FIG. 24B, the current feeding parts 116a may be formed to be partially connected with each other. For example, in the narrow electrode 116 having two current feeding parts 116a, a plurality of connecting portions 116c electrically connecting one of the current feeding parts 116a and another of the current feeding parts 116a opposed to one of the current feeding parts 116a, thereby providing a ladder-like current feeding part in the top plan view.

The light emitting device 1 in the first preferred embodiment is formed to have a substantially square shape in the top plan view, however, the present invention is not limited thereto. A vertical length and a lateral length of the light emitting device 1 in the top plan view may be different from each other. For this case, the geometry of the light emitting device 1 in the top plan view is rectangle. The size of the light emitting device 1 in the top plan view may be a large-scale chip size greater than 2 mm×2 mm.

Further, in the semiconductor multilayer structure 10 of the light emitting device 1, the conductivity type of each of the compound semiconductor layers composing the semiconductor multilayer structure 10 may be reversed from that in the first preferred embodiment. For example, the n-type contact layer 101 and the n-type cladding layer 103 may be replaced with a p-type contact layer and a p-type cladding layer, and the p-type cladding layer 107 and the p-type contact layer 109 may be replaced with an n-type cladding layer and an n-type contact layer.

(Process for Fabricating the Light Emitting Device 1)

FIGS. 4 to 21 are diagrams showing a process for fabricating the light emitting device in the first preferred embodiment.

Figure 4A:
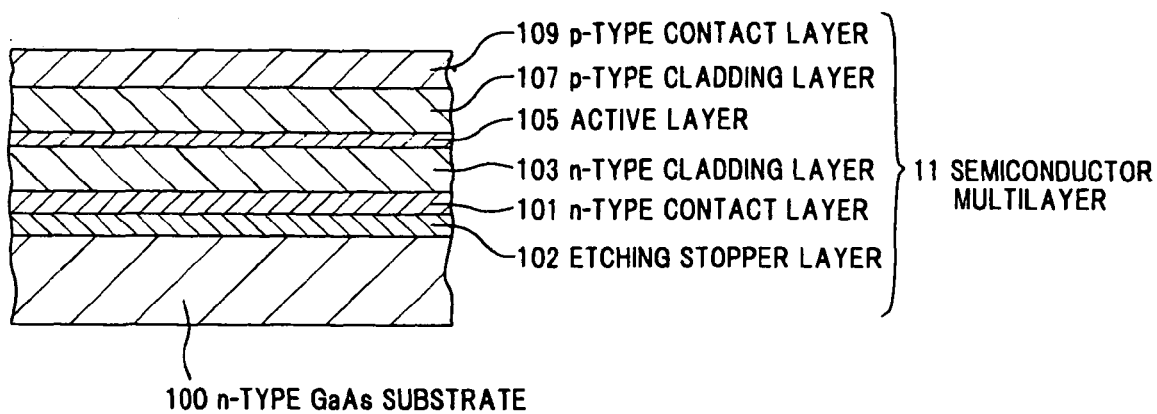

At first, as shown in FIG. 4A, an AlGaInP based semiconductor multilayer 11 including plural compound semiconductor layers comprises is grown by Metal Organic Chemical Vapor Deposition (MOCVD) on an n-type GaAs substrate 100, for example. In the first preferred embodiment, the semiconductor multilayer 11 including at least an etching stopper layer 102, an n-type cladding layer 103, the active layer 105, and a p-type cladding layer 107 is formed on the n-type GaAs substrate 100.

As an example, the etching stopper layer 102 comprising GaInP, an n-type contact layer 101 comprising GaInP, the n-type cladding layer 103 comprising AlGaInP, the quantum well type active layer 105 comprising AlGaInP, and the p-type cladding layer 107 comprising AlGaInP, and the p-type contact layer 109 comprising GaP are grown in this order on the n-type GaAs substrate 100, to provide an epitaxial wafer in which the semiconductor multilayer 11 is formed on the n-type GaAs substrate 100. By providing the n-type contact layer 101 and the p-type contact layer 109, good electrical junction can be easily taken between the metal layer 117 and the n-type contact layer 101 as well as between the p-type contact layer 109 and the contact part 120.

As sources used in the MOCVD method, an organometallic compound such as trimethylgallium (TMGa), triethylgallium (TEGa), trimethylaluminum (TMAl), and trimethylindium (TMIn), and a hydride gas such as arsin ($AsH_3$) and phosphine ($PH_3$) may be used. Further, as a source of the n-type dopant, disilane ($Si_2H_6$) may be used. As a source of the p-type dopant, biscyclopentadienyl magnesium ($Cp_2Mg$) may be used.

Further, as the source of the n-type dopant, hydrogen selenide ($H_2Se$), monosilane ($SiH_4$), diethyl tellurium (DETe) or dimethyl tellurium (DMTe) may be used.

As the source of the p-type dopant, dimethylzinc (DMZn) or diethylzinc (DEZn) may be used.

In addition, the semiconductor multilayer 11 may be grown on the n-type GaAs substrate 100 by using Molecular Beam Epitaxy (MBE) method. In addition, the GaN system semiconductor multilayer 11 may be grown by using Halide Vapor Phase Epitaxy (HVPE) method.

Figure 4B:
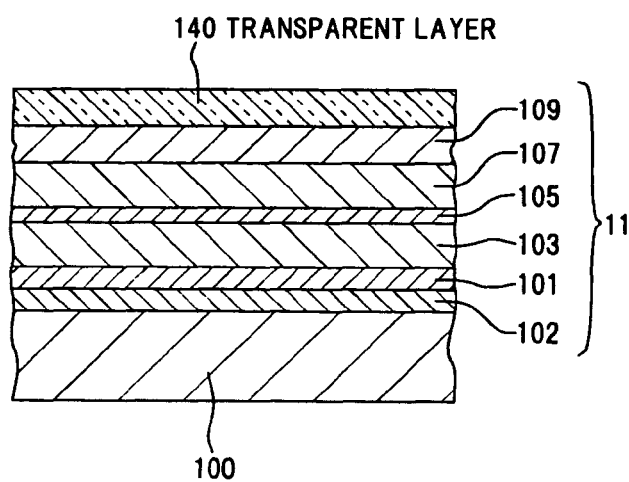

Next, as shown in FIG. 4B, after taking out the epitaxial wafer formed as shown in FIG. 4A of the MOCVD equipment, a transparent layer 140 is formed on the surface of p-type contact layer 109. In more concrete, a $SiO_2$ film as the transparent layer 140 is formed on the surface of p-type contact layer 109 by plasma Chemical Vapor Deposition (CVD) equipment. Herein, the transparent layer 140 may be formed by vacuum deposition method.

Figure 5A:
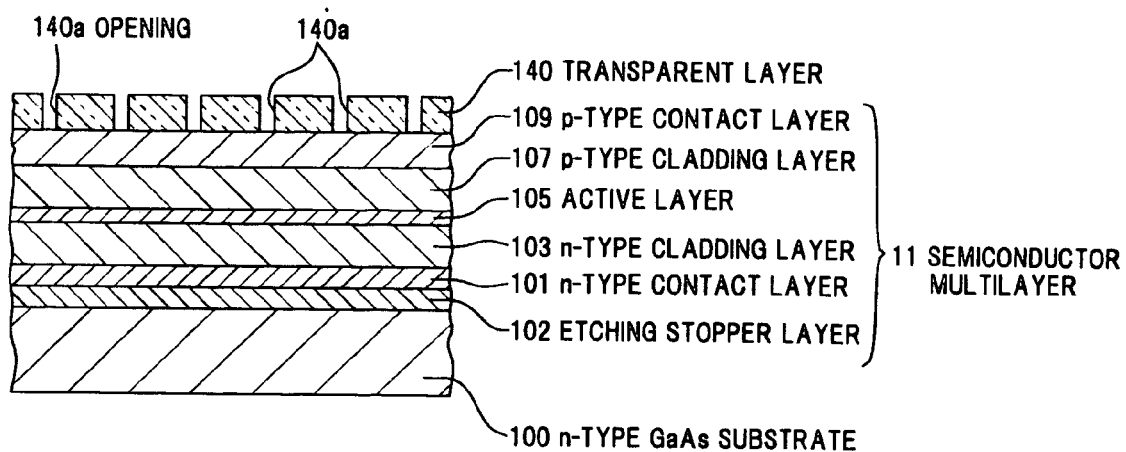

Next, as shown in FIG. 5A, openings 140a are formed at the transparent layer 140 by using photolithography method and etching method. For example, a photoresist pattern having a groove at a region corresponding to the opening 140 as is formed on the transparent layer 140. The openings 140a are formed to penetrate from a surface of the transparent layer 140 to the interface between the p-type contact layer 109 and the transparent layer 140. In more concrete, the openings 140a are formed at the transparent layer 140 by removing regions where the photoresist pattern is not formed of the transparent layer 140 with use of a fluorinated acid based etchant diluted with demineralized water. The openings 140 are formed at regions where the contact parts 120 will be provided.

Figure 5B:
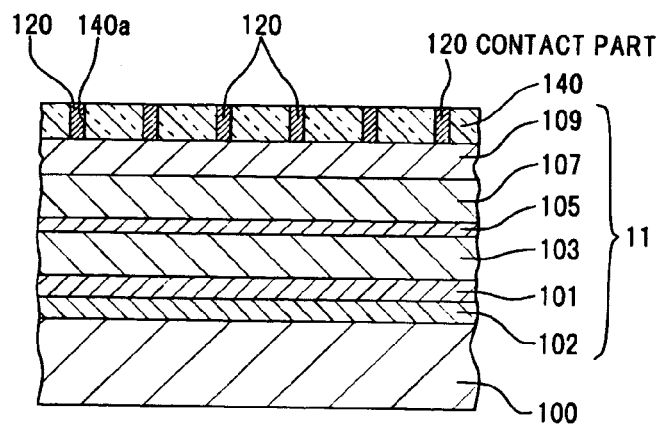

Subsequently, as shown in FIG. 5B, a AuZn alloy which is a material composing the contact part 120 is formed within the opening 140a by using the vacuum deposition method and lift-off method. For example, AuZn is vacuum-evaporated within the opening 140a by using the photoresist pattern for forming the opening 140a as a mask, to provide the contact part 120.

Figure 6:
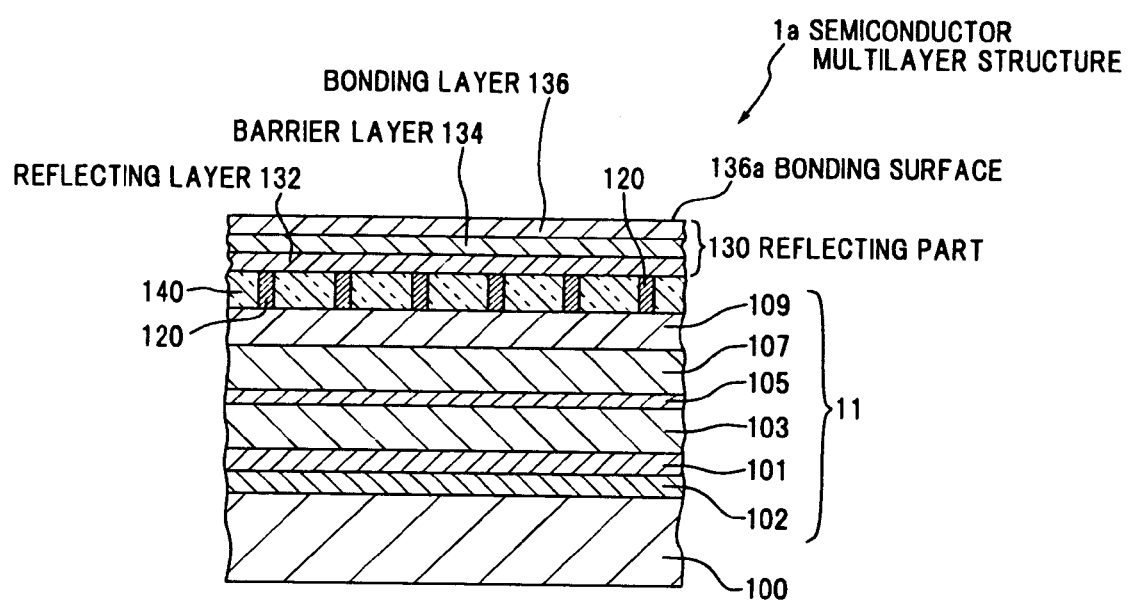

Next, as shown in FIG. 6, a Au layer as the reflecting layer 132, a Ti layer as the barrier layer 134, and a Au layer as the bonding layer 136 are formed on the transparent layer 140 and the contact part 120 by using the vacuum deposition method or sputtering method, to provide a semiconductor multilayer structure 1a. The barrier layer 134 may be formed by laminating high-melting material (refractory material) layers such as Ti layer and Pt layer as long as it suppresses the propagation of the material composing the bonding layer 136 to the reflecting layer 132. In addition, an adhesion thin film for improving adhesion of the reflecting layer 132 to the transparent layer 140 may be further provided between the transparent layer 140 and the reflecting layer 132. This adhesion thin film is formed to have a thickness that does not absorb the light emitted from the active layer 105. As the reflecting layer 132, a material having a high reflectivity with respect to the wavelength of the light emitted from the active layer 105 is selected.

Figure 7A:
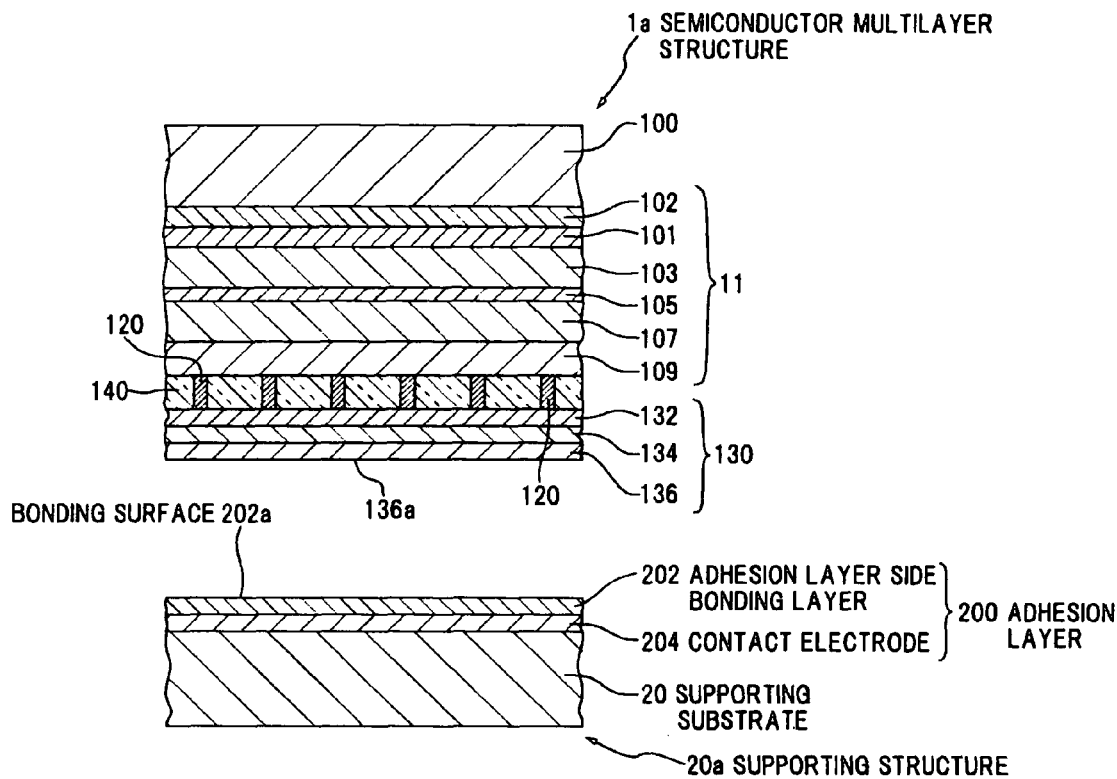

Next, as shown in FIG. 7A, Ti as the contact electrode 204 and Au as the bonding layer 202 are formed in this order on the Si substrate as the supporting substrate 20 by using the vacuum deposition method, to provide a supporting structure 20a. Successively, a bonding surface 136a which is a surface of the bonding layer 136 of the semiconductor multilayer structure 1a and a bonding surface 202a which is a surface of the bonding layer 202 of the supporting structure 20a are stuck to be facing to each other, and held in this state by a jig made from carbon or the like.

Next, the jig holding the state that the semiconductor multilayer structure 1a is stuck on the supporting structure 20a is introduced in a wafer bonding equipment (For example, a wafer bonding equipment for micromachine). Then, the wafer bonding equipment is depressurized to a predetermined pressure. A pressure is applied substantially uniformly through the jig to the semiconductor multilayer structure 1a and the supporting structure 20a overlapped with each other. Next, the jig is heated to a predetermined temperature with a predetermined rate of temperature elevation.

Figure 7B:
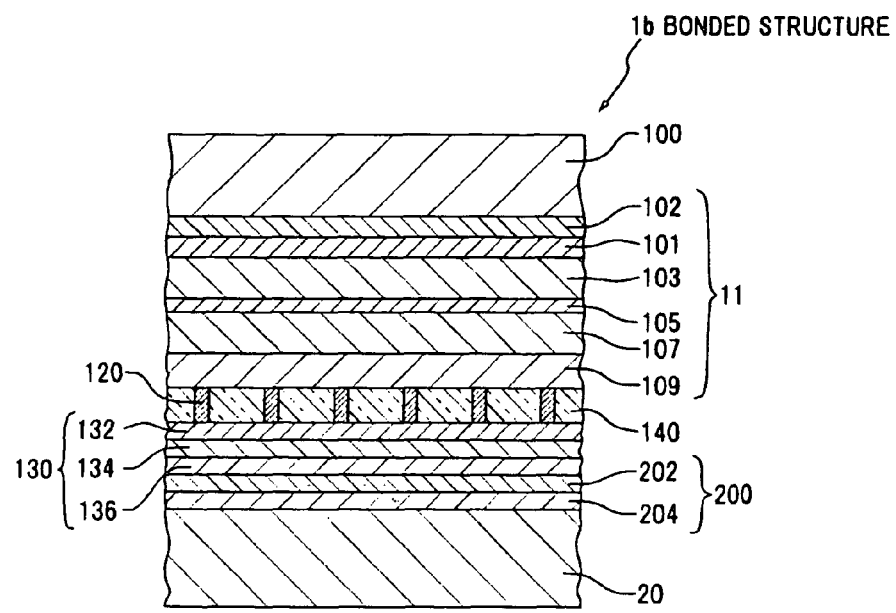

In more concrete, the temperature of the jig is raised to 350° C. After the temperature of the jig reached to 350° C., the jig is held at the temperature of 350° C. for about 1 hour. Then, the jig is gradually cooled and the temperature of the jig is decreased enough, for example, to the room temperature. After the temperature of the jig fell, the pressure applied to the jig is left open. After the pressure in the equipment is decreased to an atmospheric pressure, the jig is taken out from the equipment. According to this process, as shown in FIG. 7B, a bonded structure 1b in which the semiconductor multilayer structure 1a and the supporting structure 20a are mechanically bonded with each other between the bonding layer 136 and the bonding layer 202.

In the first preferred embodiment, the semiconductor multilayer structure 1a comprises the barrier layer 134. Therefore, even though the semiconductor multilayer structure 1a and the supporting structure 20a are bonded to each other by using the bonding surface 136a and the bonding surface 202a, it is possible to suppress the diffusion of the material composing the bonding layer 136 and the bonding layer 202 into the reflecting layer 132, thereby suppressing the deterioration of the reflecting property of the reflecting layer 132.

Next, the bonded structure 1b is stuck by an attaching wax on a jig of a lapping equipment. In concrete, a surface at a side of the supporting substrate 20 is attached to the jig. Then, the n-type GaAs substrate 100 of the bonded structure 1b is lapped to have a predetermined thickness. For example, the n-type GaAs substrate 100 is lapped until a remaining thickness of the n-type GaAs substrate 100 becomes 30 µm. Subsequently, the bonded structure 1b after lapping is detached from the jig of the lapping equipment, and the wax bonded to the surface of the supporting substrate 20 is removed by cleaning.

Figure 8A:
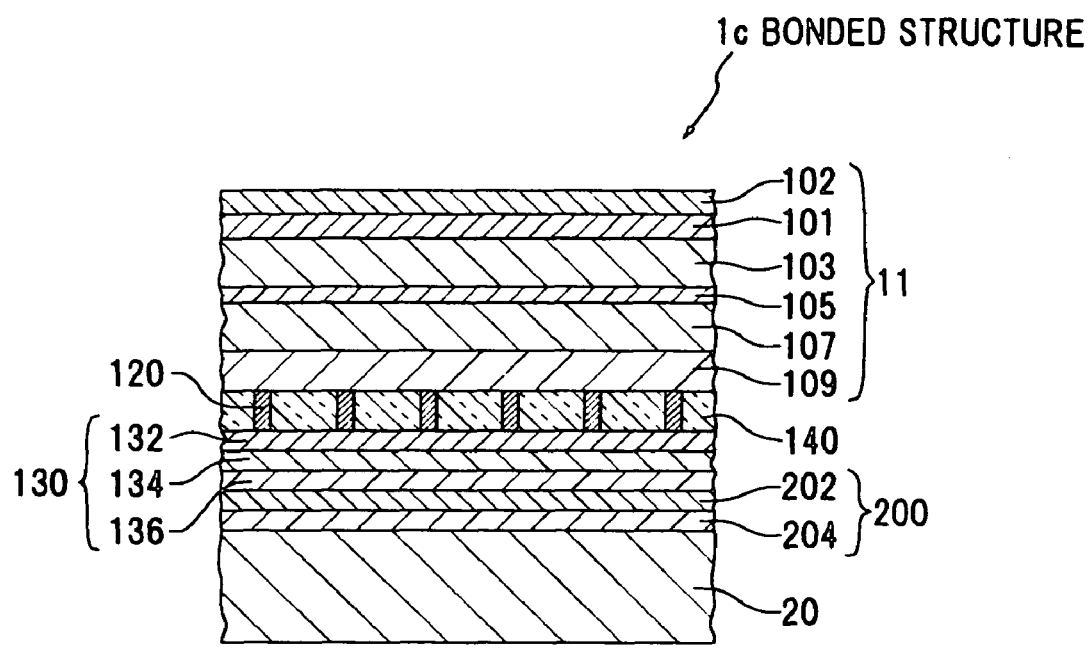

Thereafter, as shown in FIG. 8A, the n-type GaAs substrate 100 is completely removed from the bonded structure 1b after lapping by selective etching using an etchant for GaAs etching, to form a bonded structure 1c in which an etching stopper layer 102 is exposed. As the etchant for GaAs etching, a mixture of ammonia water and hydrogen peroxide water may be used. In addition, the n-type GaAs substrate 100 may be completely removed by selective etching without lapping the n-type GaAs substrate 100.

Figure 8B:
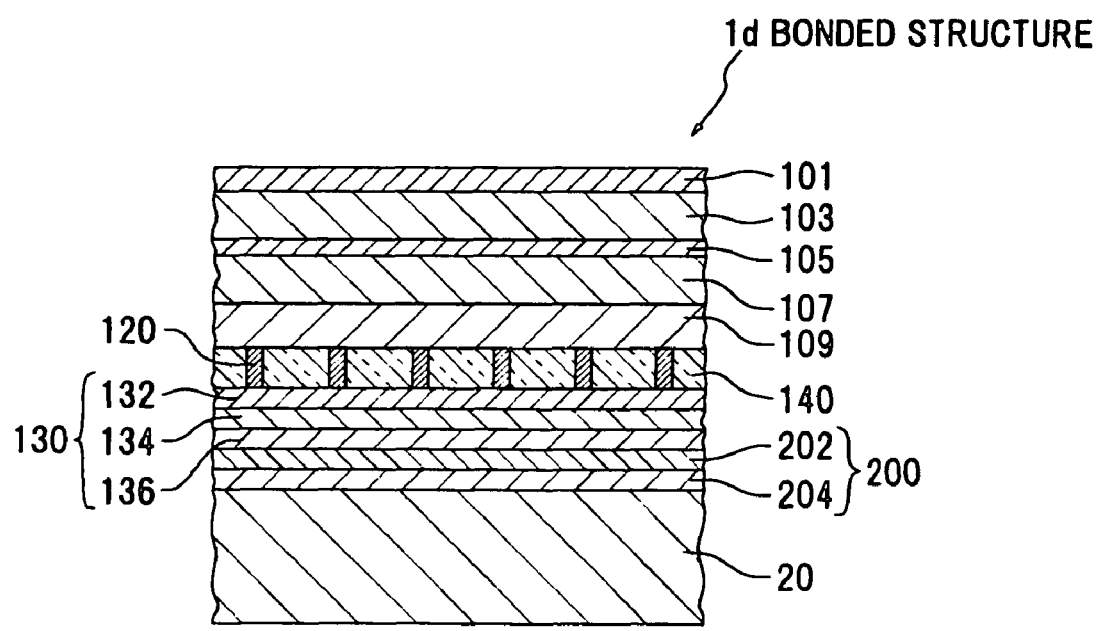

Subsequently, as shown in FIG. 8B, the etching stopper layer 102 is removed from the bonded structure 1c by etching with use of a predetermined etchant, to form the bonded structure 1d in which the etching stopper layer 102 is removed. When the etching stopper layer 102 comprises GaInP, an etchant including hydrochloric acid may be used. According to this step, a surface of the n-type contact layer 101 is exposed to the outside.

Next, as shown in FIG. 9, a mask pattern 30 is formed at the surface of the n-type contact layer 101. The mask pattern 30 is formed on a region corresponding to a metal layer 117. In concrete, the mask pattern 30 is formed at regions in each of which the narrow electrode 116 shown in FIG. 1 is formed and which corresponds to the region in which the metal layer 117 shown in FIG. 3 is formed. According to this step, a bonded structure 1e, in which the mask pattern 30 is formed at each of device regions 50 where the light emitting device 1 is formed, is provided.

Figure 10:
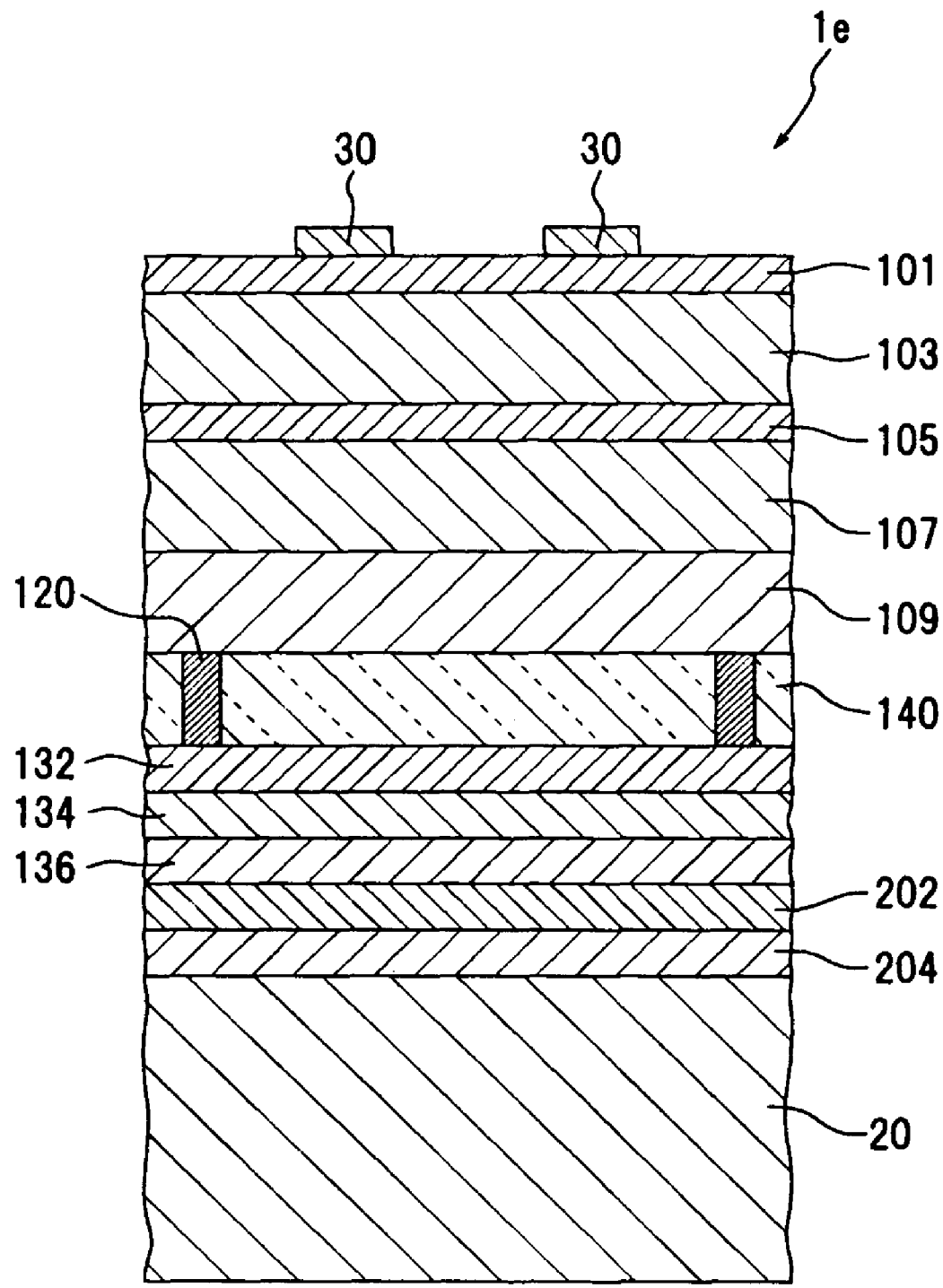

FIG. 10 is a cross sectional view along C-C line of the light emitting device 1 shown in FIG. 9.

As shown in FIG. 10, each of the mask patterns 30 of the bonded structure 1e is formed at a region corresponding to the thin line-shaped n-type cladding layer 101 to be formed on the n-type cladding layer 103 in the light emitting device 1 according to the first preferred embodiment. Namely, the mask pattern 30 is formed to correspond to the current feeding part 116a to be provided in the light emitting device 1 as shown in FIG. 3.

Figure 11:
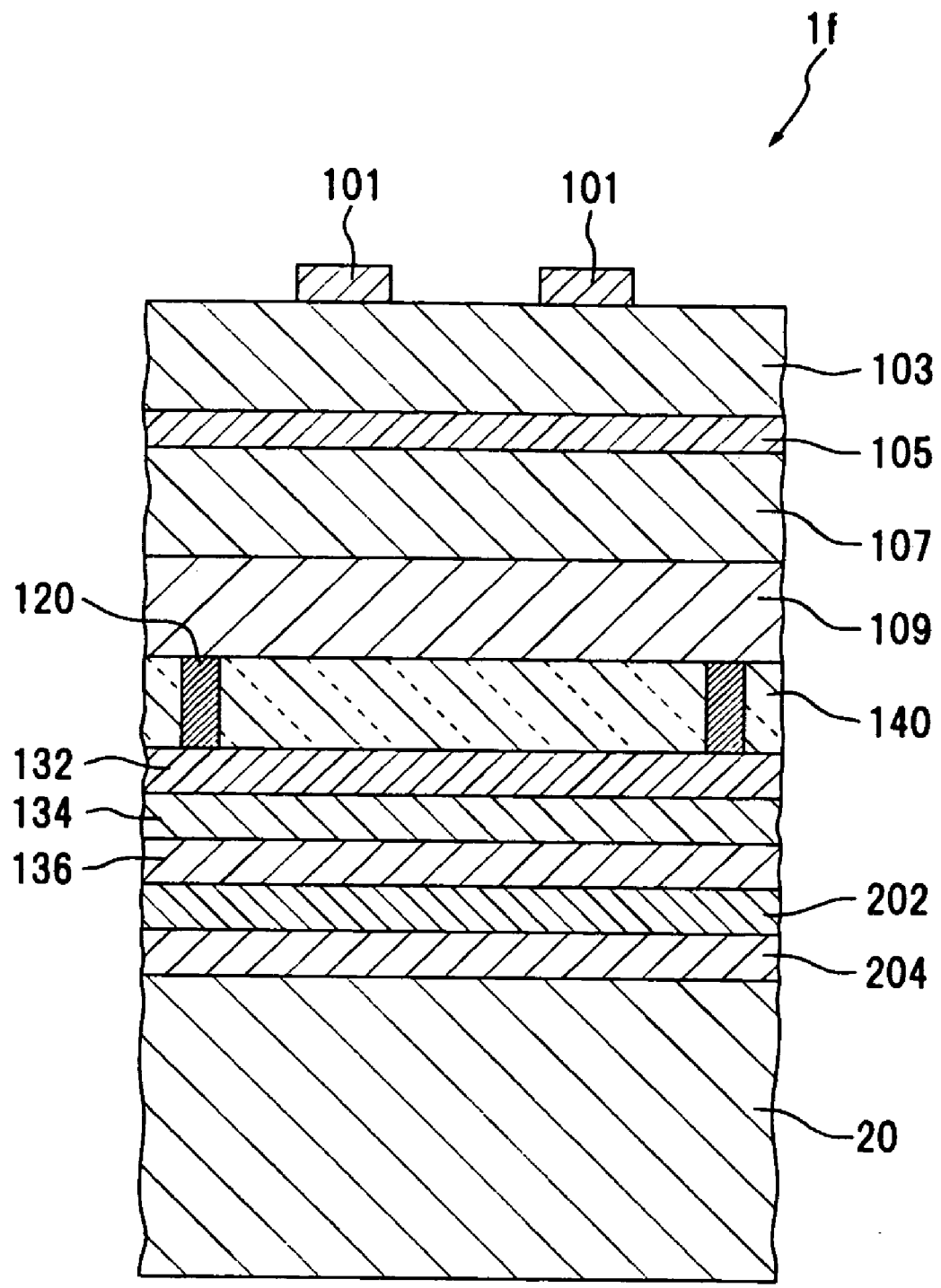

Next, the etching treatment using a mixture of sulfuric acid and hydrogen peroxide water is performed on the n-type contact layer 101 with using the mask pattern 30 as a mask. According to this step, the region provided with no mask pattern 30 of the n-type contact layer 101 is removed. After completing the etching of the n-type contact layer 101, the mask pattern 30 is removed, to provide a bonded structure 1f, in which the n-type contact layer 101 remains at the region on the n-type cladding layer 103 where the metal layer 117 described below is to be formed as shown in FIG. 11. By using the above mixture, it is possible to selectively etch the n-type contact layer 101 comprising GaAs as against the n-type cladding layer 103 comprising the n-type AlGaInP. Therefore, in the bonded structure 1f, a surface of the n-type cladding layer 103 is exposed to the outside.

Figure 12:
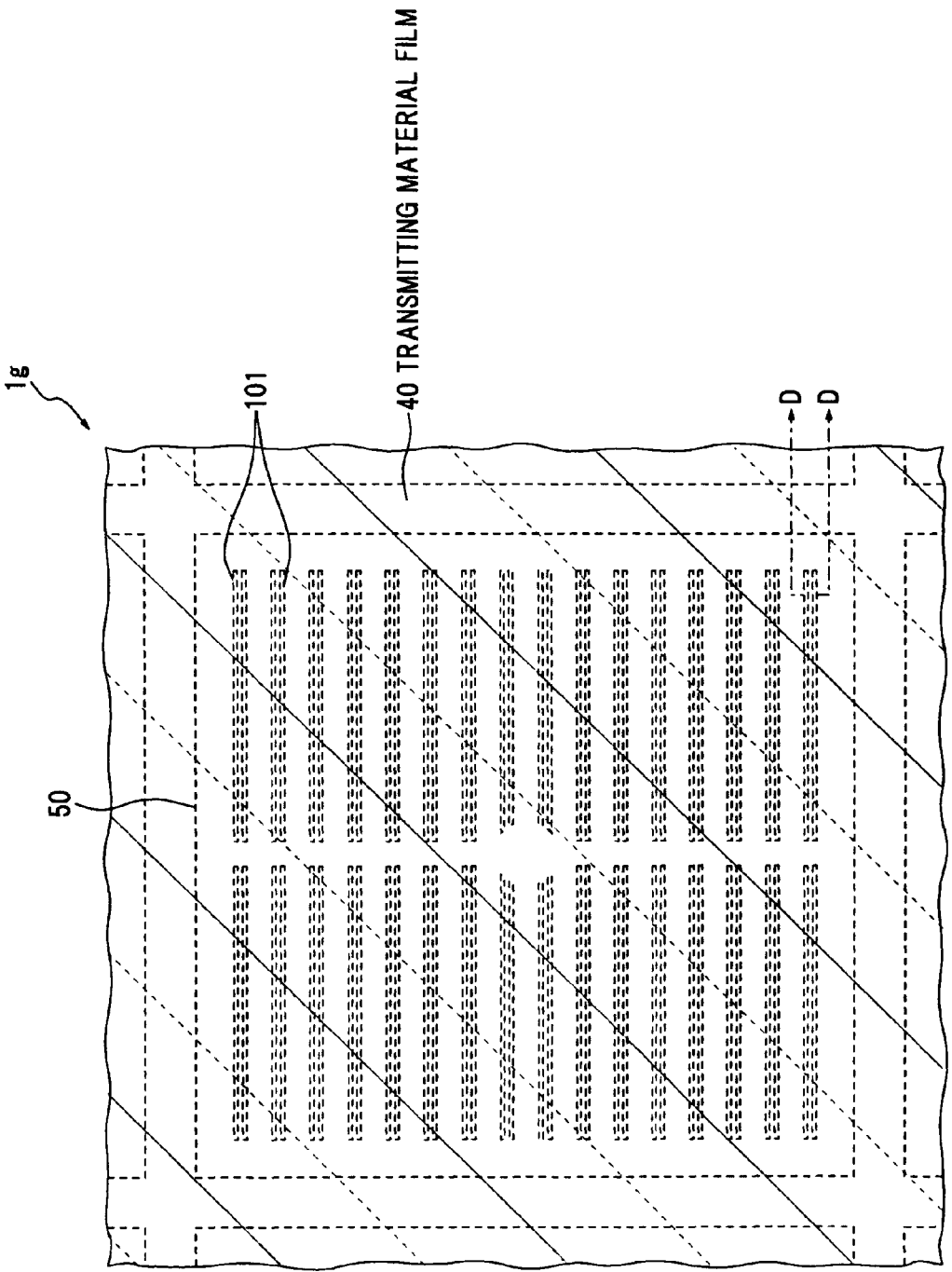

Next, the transmitting material film 40 is formed on the entire surface of the surface of the bonded structure 1f, thereby forming a bonded structure 1g as shown in FIG. 12. In concrete, the transmitting material film 40 having a thickness enough for coating the n-type contact layer 101 of the bonded structure 1f and comprising a material transmitting the light emitted from the active layer 105 is formed by film formation method such as CVD method. For example, the transmitting material film 40 comprises a SiO$_2$ film formed by the CVD method.

Figure 13:
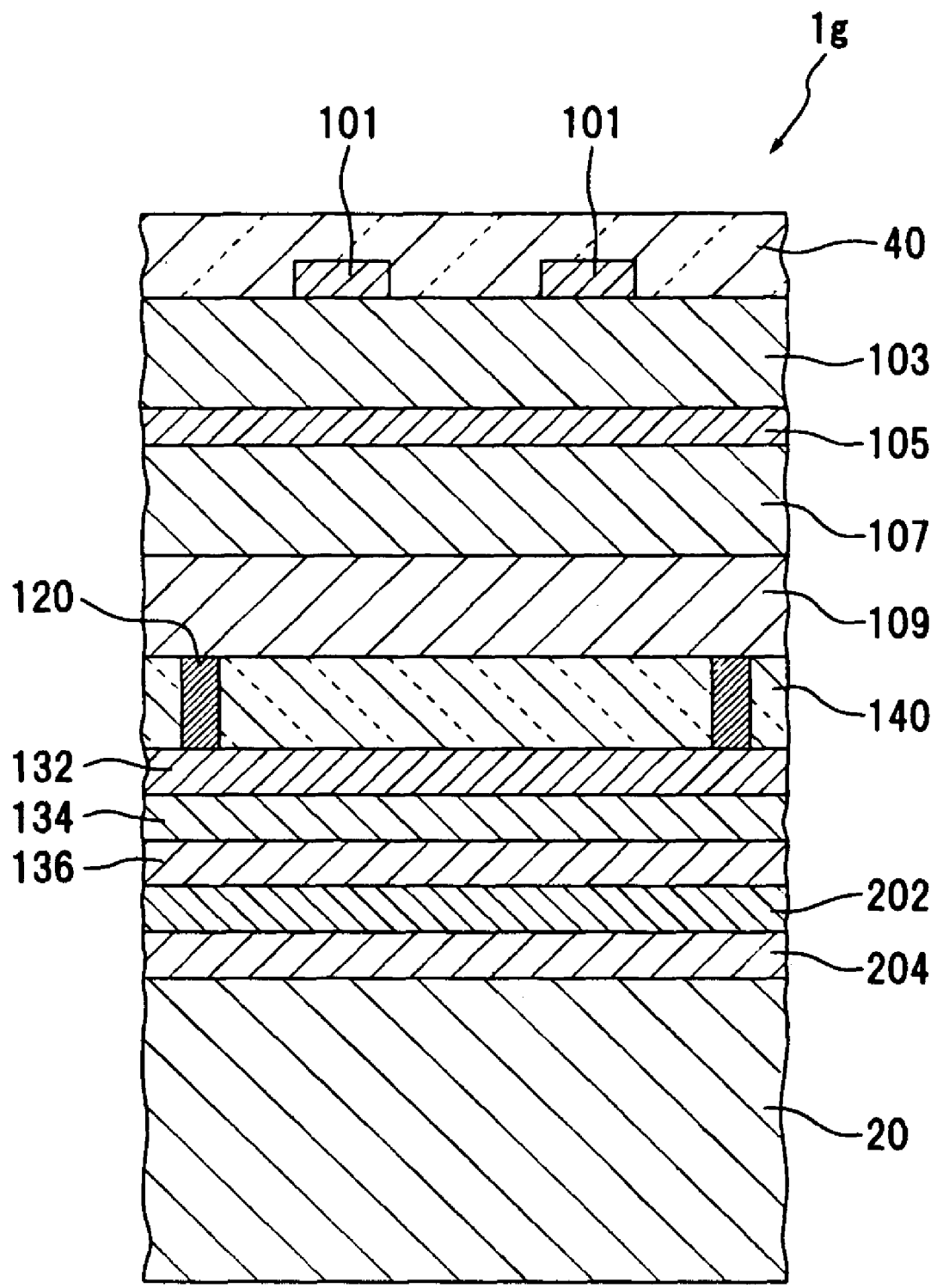

FIG. 13 is a cross sectional view along D-D line of FIG. 12.

As shown in FIG. 13, the n-type contact layer 101 of the bonded structure 1g is covered with the transmitting material film 40.

Subsequently, a mask pattern is formed on a region where the transmitting material film 40 should remain by using the photolithography method. The mask pattern is formed on the region where the surface center electrode part 110 shown in FIG. 1 and the light reflecting part 116b shown in FIG. 3 will be formed, thereby exposing to the outside a region other than the region where the mask pattern is formed. Next, the transmitting material film 40 exposed to the outside is removed by the etching. After having removed the transmitting material film 40 at the region other than the region where the surface center electrode part 110 and the light reflecting part 116b will be formed, the mask pattern is removed, thereby forming a bonded structure 1h as shown in FIG. 14.

Figure 14:
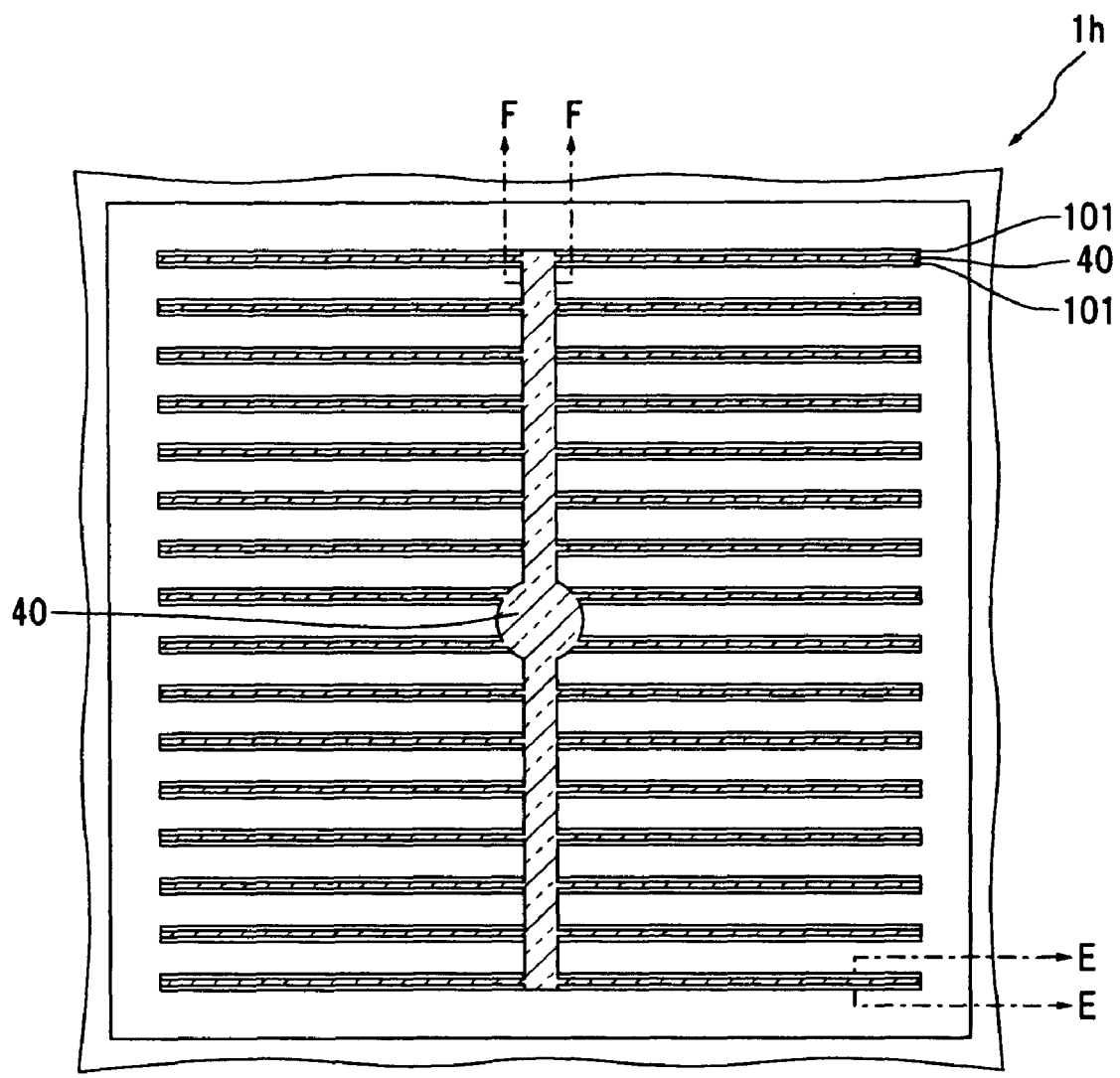
Figure 15:
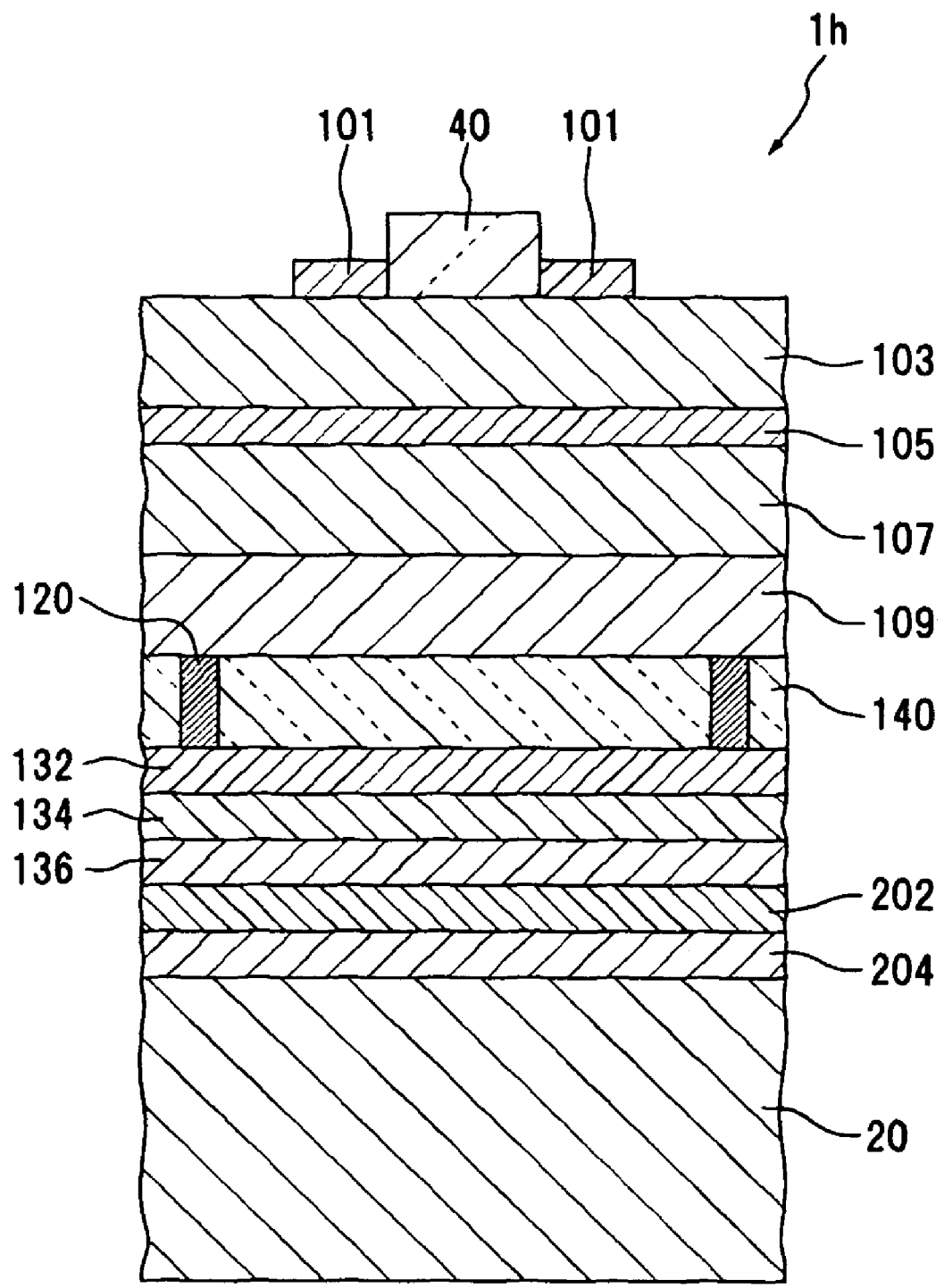

FIG. 15 is a cross sectional view along E-E line of FIG. 14. In the bonded structure 1h, the transmitting material film 40 remains between the n-type contact layer 101 positioned right under the region where the narrow electrode 116 will be formed and another n-type contact layer 101 facing to the n-type contact layer 101. Herein, the thickness of the transmitting material film 40 is thicker than the thickness of the n-type contact layer 101.

Figure 16:
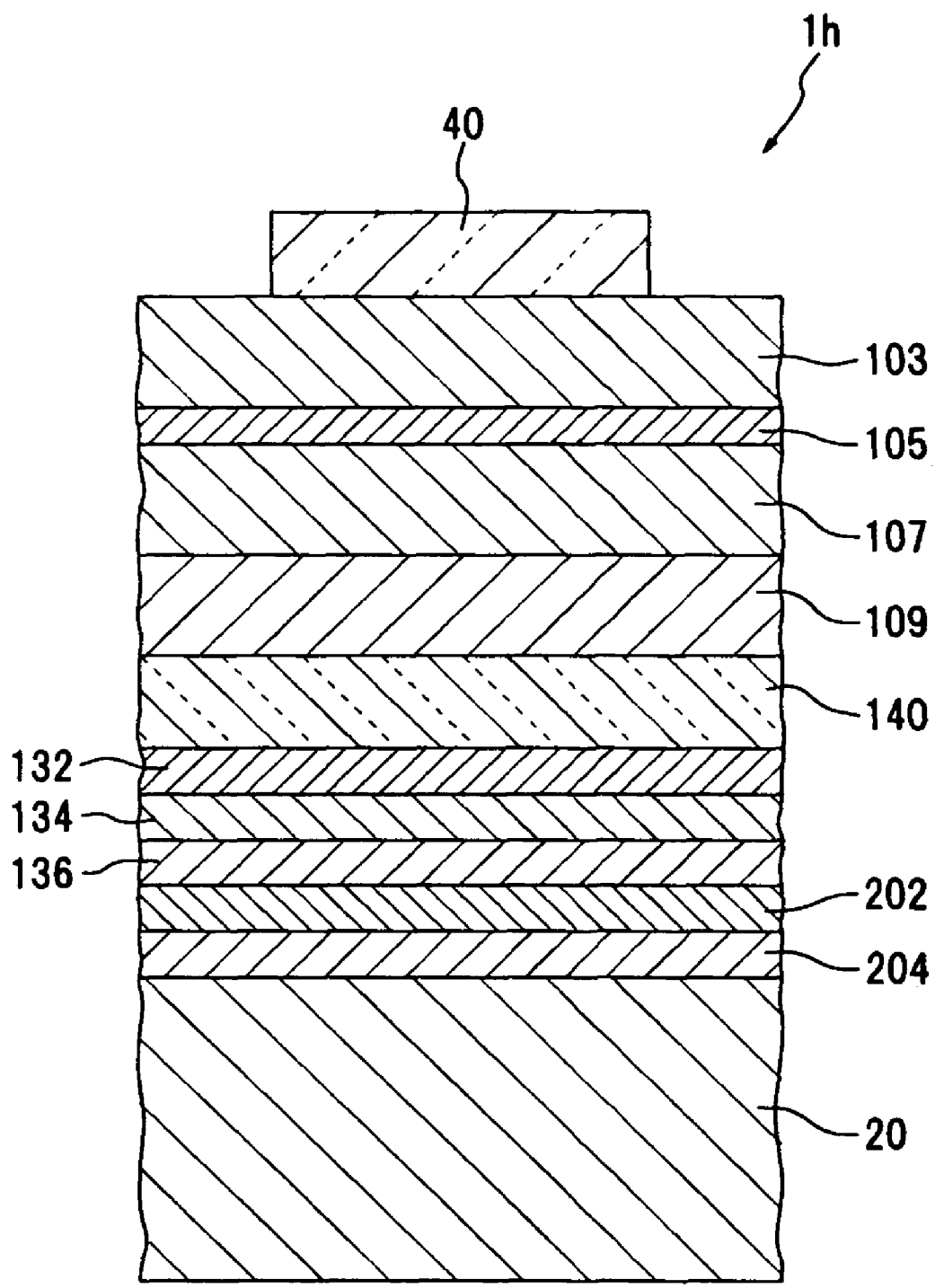

FIG. 16 is a cross sectional view along F-F line of FIG. 14. In the bonded structure 1h, the transmitting material film 40 is formed on the n-type cladding layer 103 positioned right under the region where the surface center electrode part 110 will be formed.

Figure 17:
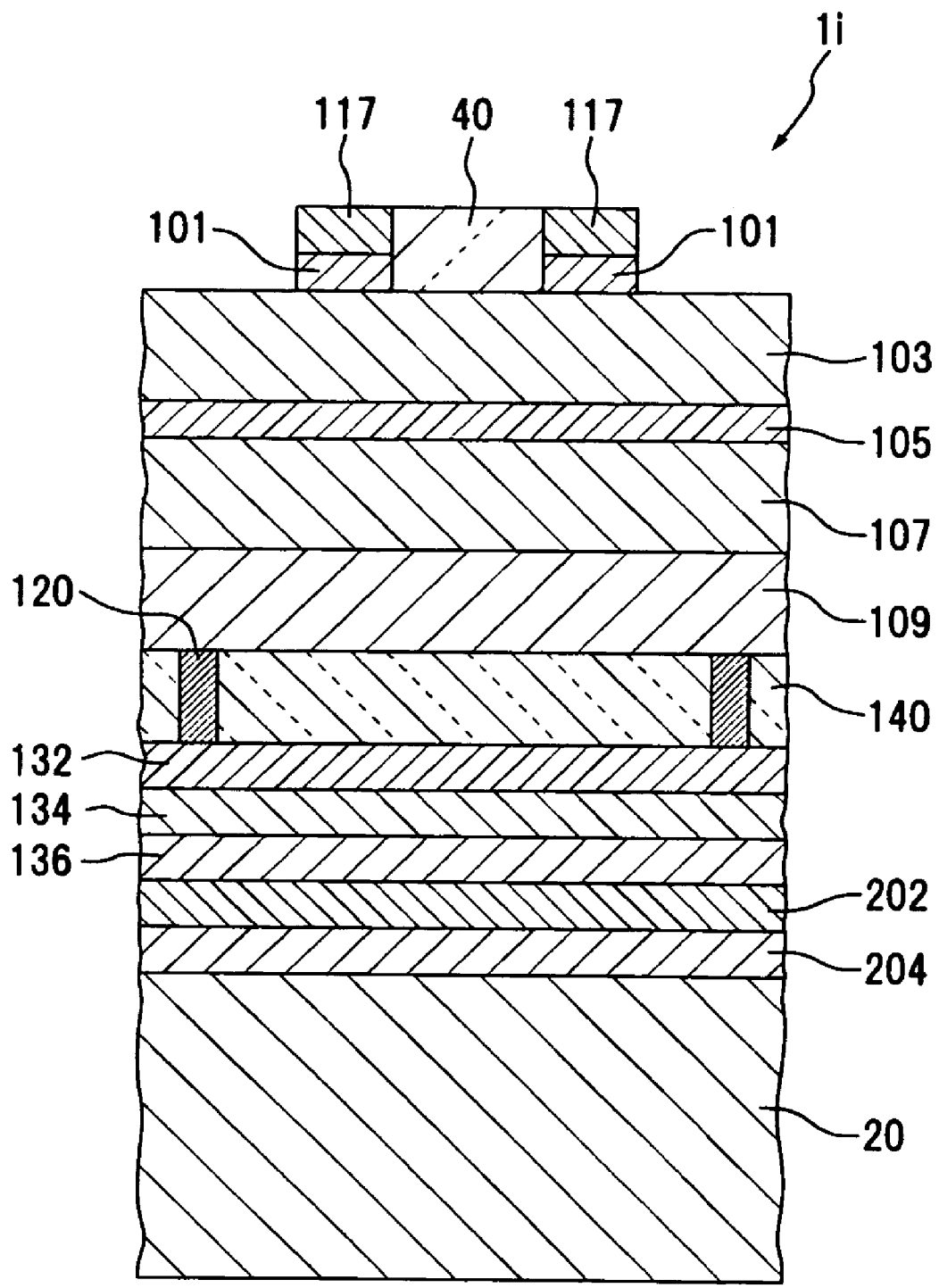

Next, the mask pattern exposing the surface of the n-type contact layer 101 is formed by using the photolithography method. Namely, the mask pattern is formed at the region other than the surface of the n-type contact layer 101. Thereafter, a metallic material is deposited on the n-type contact layer 101 by the vacuum deposition method. For example, the metallic material is formed by depositing AuGe alloy, Ni, and Au in this order on the n-type contact layer 101. Subsequently, after having removed the mask pattern, alloying process (alloy process) is performed on the bonded structure 1h in which the metallic material is formed. As an example, the alloy process is carried out on the bonded structure 1h at a temperature of around 400° C. in a nitrogen atmosphere as an inert atmosphere. As a result of this alloy process, the metallic material is in ohmic-contact with the n-type contact layer 101, so that the metal layer 117 is formed, thereby providing a bonded structure 1i in which the metal layer 117 is formed on the n-type contact layer 101 as shown in FIG. 17.

Figure 18:
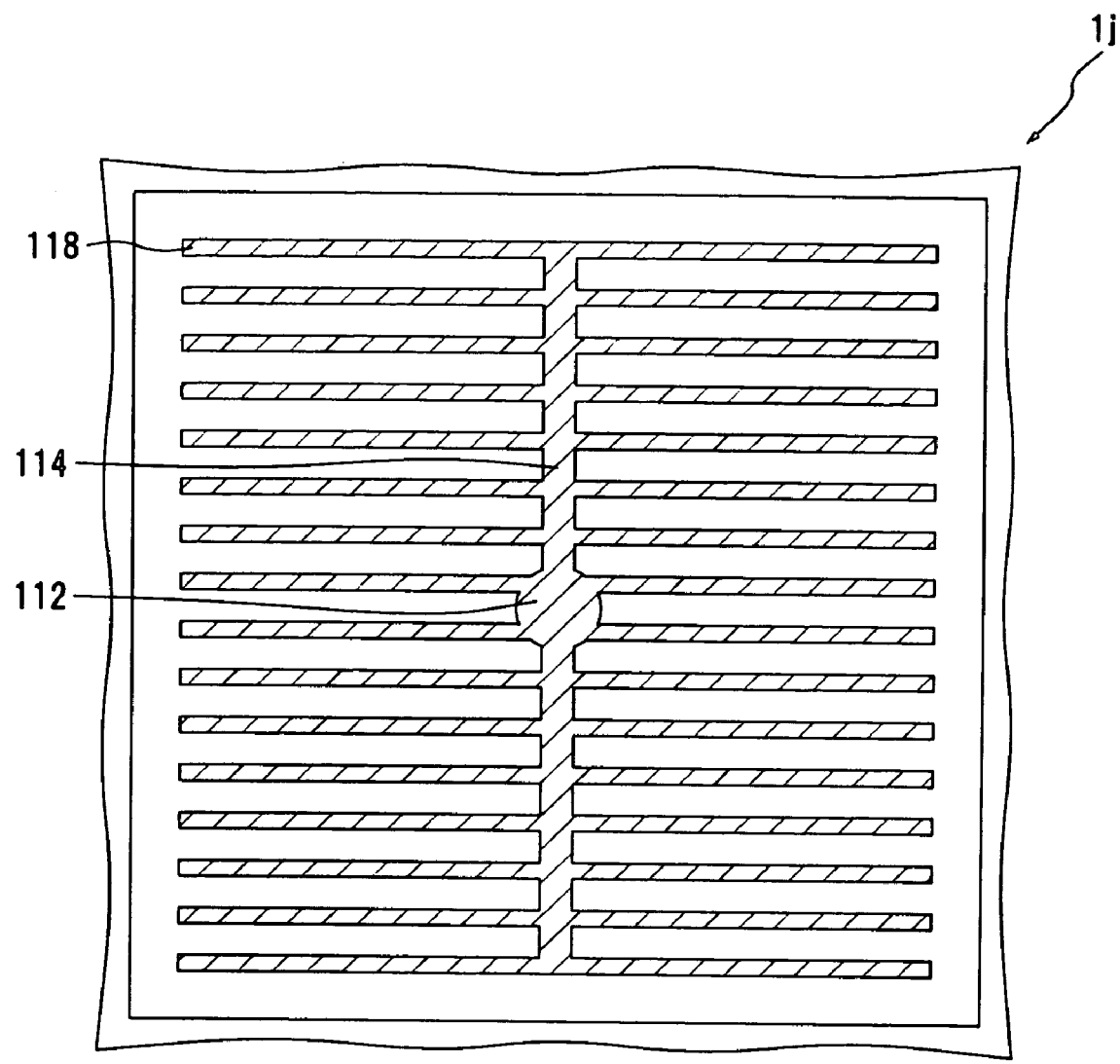

Subsequently, a mask pattern having an opening at a region where the surface center electrode part 110 and the metal layer 118 will be formed by using the photolithography method. Namely, the mask pattern is formed to comprise openings for exposing the surface of a part of the transmitting material film 40 provided at the region where the surface center electrode part 110 will be formed as well as the surface of another part of the transmitting material film 40 and the surface of the metal layer 117 provided at the region where the narrow electrode 116 will be formed. Next, the surface center electrode part 110 (i.e. the pad 112 and the linear electrode 114) and the narrow electrode metal layer 118 are formed by the vacuum deposition method or the sputtering method. As an example, the surface center electrode part 110 and the narrow electrode metal layer 118 comprise a lower part metal layer (e.g. Al) and an uppermost surface metal layer (e.g. Au). Herein, the uppermost surface metal layer may be formed to have a thickness greater than a thickness of the lower metal layer. As a result, a bonded structure 1j as shown in FIG. 18 is formed.

Figure 19:
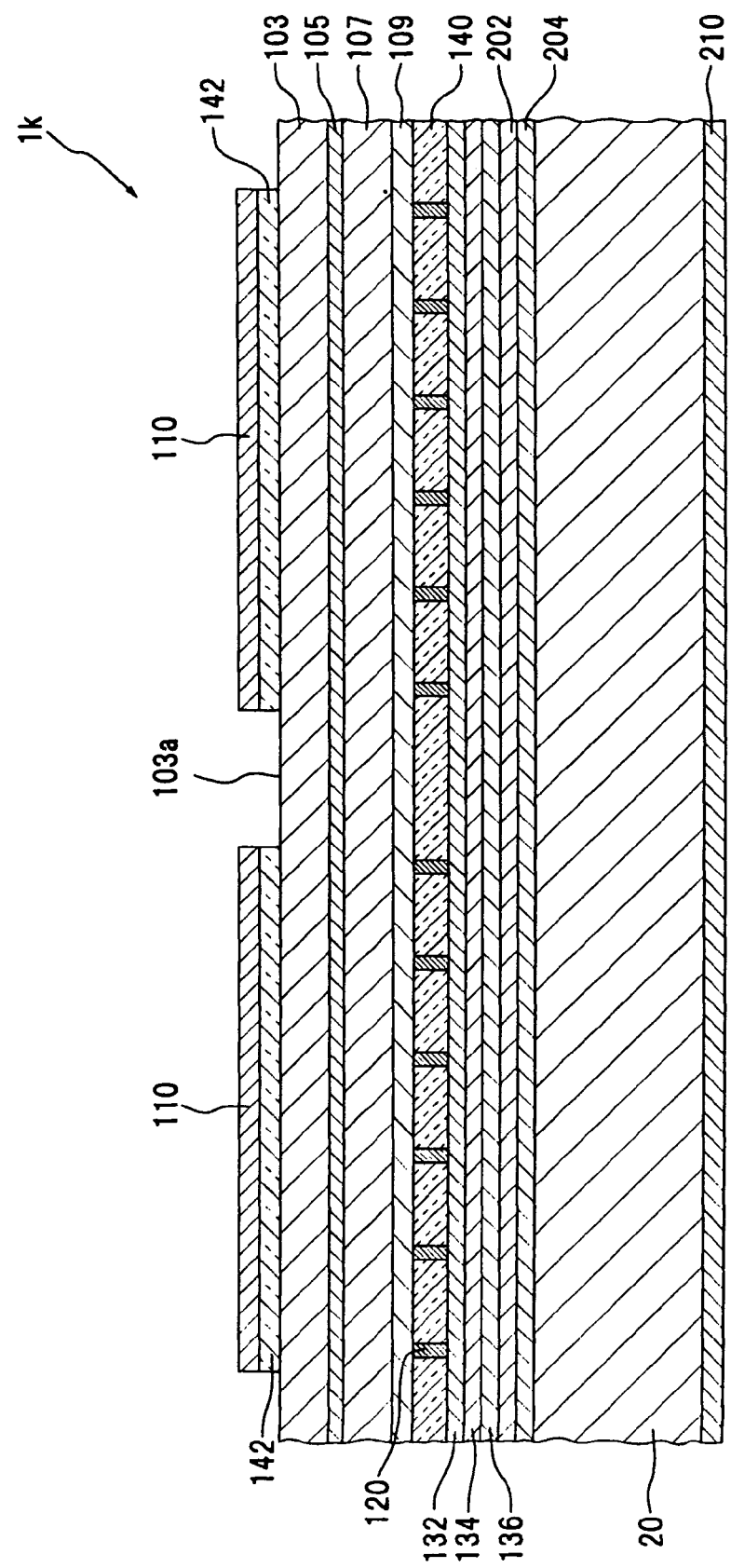

Next, a back surface electrode 210 is formed at a rear surface of the supporting substrate 20 by using the vacuum deposition method or the sputtering method. For the purpose of establishing the ohmic-contact between the back surface electrode 210 and the supporting substrate 20, the alloy process is carried out at a predetermined temperature in the inert atmosphere, for example, thereby forming a bonded structure 1k comprising the back surface electrode 210 as shown in FIG. 19.

In addition, a convexo-concave portion may be formed at the surface exposed to the outside of the n-type cladding layer 103 before or after this alloy process, for the purpose of improving the light extraction efficiency. For example, the convexo-concave portion may be formed as follows. At first, a mask pattern in which openings with micron order are regularly or irregularly arranged is formed on the n-type cladding layer 103 by the photolithography method. Then, the minute convexo-concave portion may be formed at the surface of the n-type cladding layer 103 by etching the surface of the n-type cladding layer 103 with the use of this mask pattern as mask.

Figure 20:
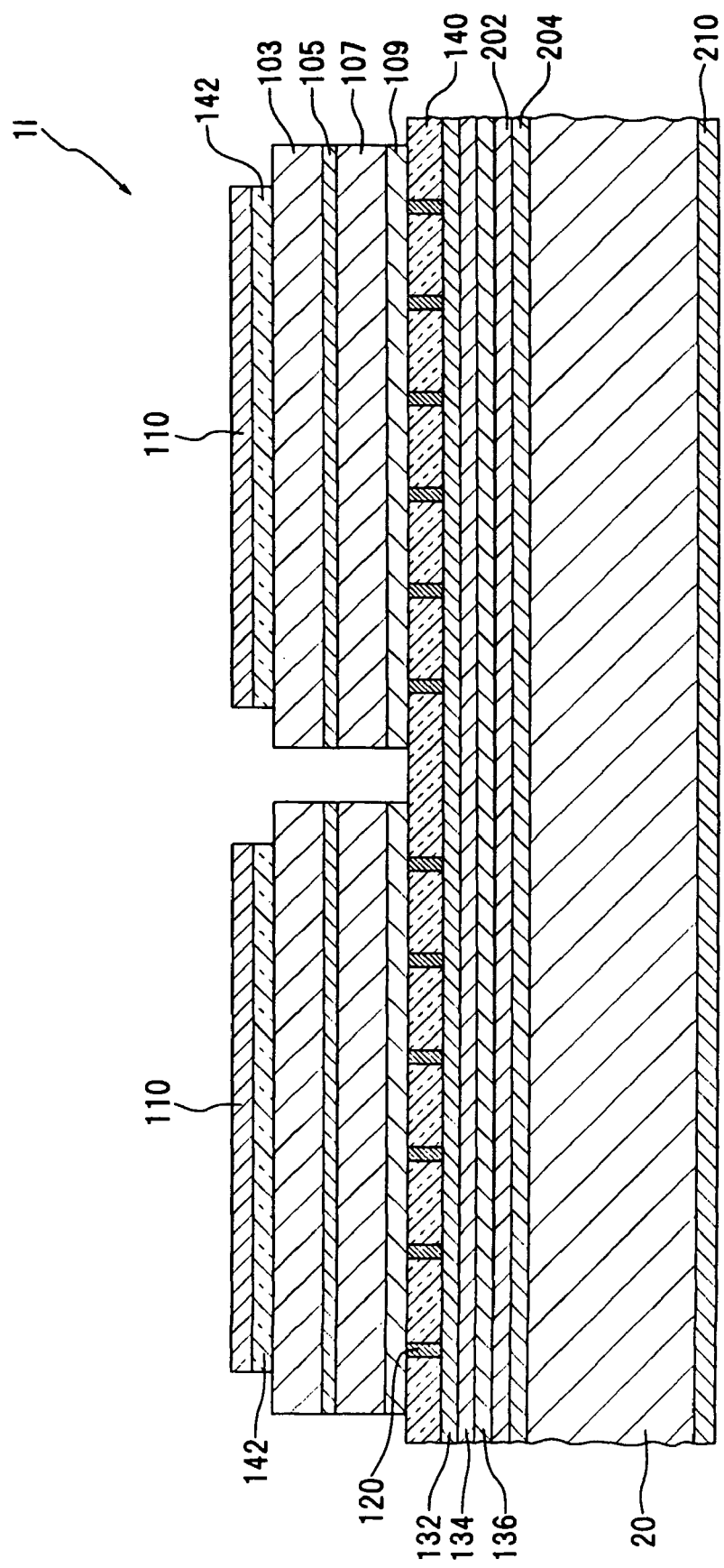

Subsequently, a mask pattern for isolating the light emitting devices is formed at the surface of the bonded structure 1k by the photolithography method. In other words, the mask pattern for isolating the light emitting devices is formed at the surface of the n-type cladding layer 103 of the bonded structure 1k. Then, the layers from the side of the surface of the n-type cladding layer 103 to the p-type contact layer 109 are removed by wet etching with the use of the mask pattern as mask, to isolate the light emitting devices from each other. As a result, a bonded structure 1l in which the light emitting devices are isolated is formed as shown in FIG. 20.

Figure 21:
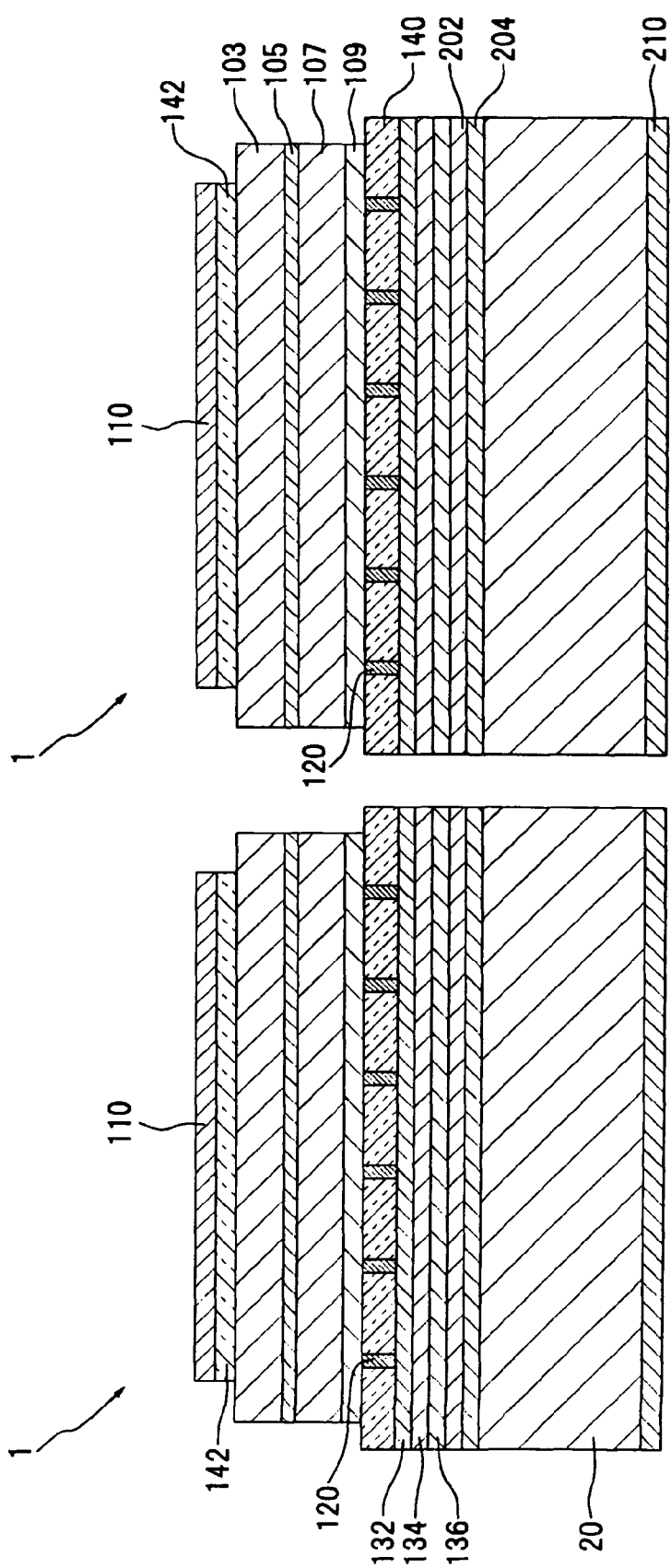

Thereafter, the bonded structure 1l is device-isolated by using a dicing equipment having a dicing blade, thereby forming a plurality of the light emitting devices 1 in the first preferred embodiment as shown in FIG. 21. For this case, as the semiconductor layers including the active layer 105 of the bonded structure 1l are isolated by the wet etching, it is possible to suppress introduction of the mechanical defect into the semiconductor layers including the active layer 105.

Effect of the First Preferred Embodiment

The light emitting device 1 in the first preferred embodiment is such construed that the surface center electrode part 110 and the light reflecting part 116b of the narrow electrode 116 reflect back the light emitted from the active layer 105, so that it is possible to reflect the light at the surface center electrode part 110 and the light reflecting part 116b. Therefore, it is possible to reduce the light absorption loss in the surface center electrode part 110 and the narrow electrode 116, thereby remarkably improving the light extraction efficiency.

Further, in the light emitting device 1, the electrodes are provided as the surface center electrode part 110 having an enough cross section to avoid the burnout due to the large current of ampere class and the narrow electrode 116 having the current feeding part 116a for supplying the current supplied to the surface center electrode part 110 toward the semiconductor multilayer structure 10, so that it is possible to prevent the narrow electrode 116 from burnout due to the large current flow. According to this structure, since it is not necessary to increase the width of the narrow electrode 116, it is possible to reduce the light absorption loss in the current feeding part 116a of the narrow electrode 116 at minimum.

Still further, in the light emitting device 1, the surface center electrode part 110 to which the large current is supplied mainly provides a function of reflecting back the light except the function for supplying the current to the narrow electrode 116. Therefore, even in the case that the width of the linear electrode 114 of the surface center electrode part 110 is increased, the light absorption by the surface center electrode part 110 is substantially negligible, thereby remarkably improving the light extract efficiency.

In addition, the light emitting device 1 in the first preferred embodiment has a large chip size, and the high luminescence emission can be realized by a single light emitting device 1, so that it is possible to largely reduce a power consumption of a lighting system, by making the light emitting devices in the lighting system having a plurality of the light emitting devices arranged in columns and/or rows from the light emitting device 1 in the first preferred embodiment. In addition, the light emitting device 1 in the first preferred embodiment is applicable to traffic light, building lighting and the like.

The Second Preferred Embodiment

Figure 22:
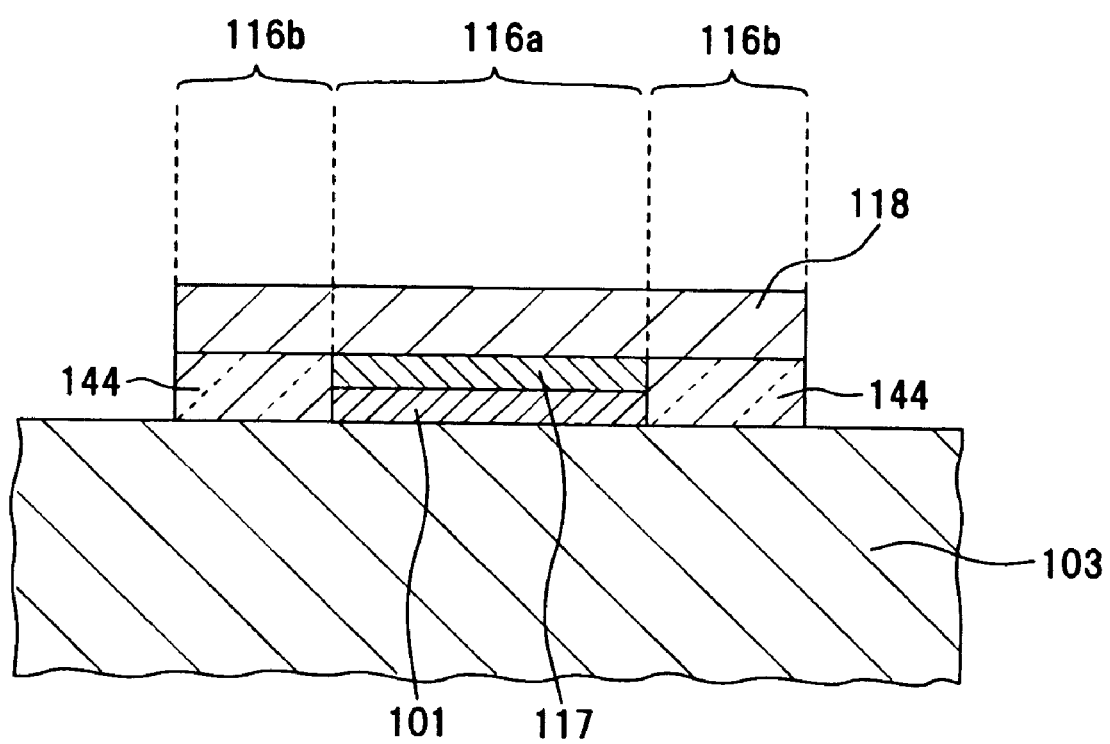
FIG. 22 is a partial cross sectional view of a light emitting device in a second preferred embodiment according to the invention.

FIG. 22 is a partial cross sectional view of a light emitting device in a second preferred embodiment according to the invention.

A structure of a light emitting device in the second preferred embodiment is substantially similar to that of the light emitting device 1 in the first preferred embodiment, except a structure of the narrow electrode 116. Therefore, detailed description thereof is omitted except the dissimilarity.

The narrow electrode 116 of the light emitting device in the second preferred embodiment has a configuration in that the current feeding part 116a is sandwiched by two light reflecting parts 116b. In the light emitting device 1 in the second preferred embodiment, the two light reflecting parts 116b of the narrow electrode 116 reflects back the light emitted from the active layer 105.

EXAMPLES

Based on the structure of the light emitting device 1 in the first preferred embodiment according to the present invention, a light emitting device in Example was manufactured. In concrete, the light emitting device having following structure was manufactured.

At first, the semiconductor multilayer structure comprises an n-type cladding layer 103 comprising n-type AlGaInP, an active layer 105 having a quantum well structure, and a p-type cladding layer 107 comprising p-type AlGaInP. A transparent layer 140 comprises a $SiO_2$ layer. A Au layer is used as a reflecting layer 132 of a reflecting part 130, and a Au layer is used as a bonding layer 136. Further, a Au layer is used as a bonding layer 202. In addition, a conductive Si substrate with a low resistivity is used as the supporting substrate 20. Each of the transmitting layer 142 and the transmitting part 144 comprises $SiO_2$ in a thickness of 300 nm.

A metal layer 117 comprises AuGe/Ni/Au. A surface center electrode part 110 comprises Al in a thickness of 50 nm and a narrow electrode metal layer 118 comprises Au in a thickness of 2 µm. The thin film adhesion layer has a thickness of 2 nm. In addition, a pad 112 is formed to have a circular shape in the top plan view and a diameter of 200 µm. In addition, a linear electrode 114 is formed with a width of 50 µm, and the narrow electrode 116 is formed with a width of 10 µm. Further, a total number of the narrow electrode 116 is sixteen at one side (a pair of sixteen narrow electrodes 116 are arranged to oppose to each other with respect to the linear electrode 114 as a symmetric axis). In addition, a width of the light reflecting part 116b in the top plan view is 7 µm. A chip size of the light emitting device 1 is 2 mm×2 mm. In addition, minute convexo-concave processing of micron order was carried out on the light extracting surface 103a.

The light emitting device in the Example was mounted on a TO-46 stem by using a eutectic alloy. Thereafter, the pad 112 and a current injection part of the TO-46 stem were wire-connected then resin-molded with silicone. The TO-46 stem on which the light emitting device was mounted was fixed to a heat radiation jig. Following result was obtained by evaluation of characteristics of this light emitting device.

An electric current of 2 A (ampere) was supplied to the light emitting device in the Example, and an emission wavelength, an emission power output, and a forward voltage were measured. As a result, the emission wavelength was 630 nm, the emission power output was 2.1 W, and the forward voltage was 2.5V.

Comparative Example

For the purpose of comparison with the light emitting device 1 in the Example, a light emitting device 2 comprising a surface center electrode part and a narrow electrode without any function of reflecting back the light was formed.

Figure 23:
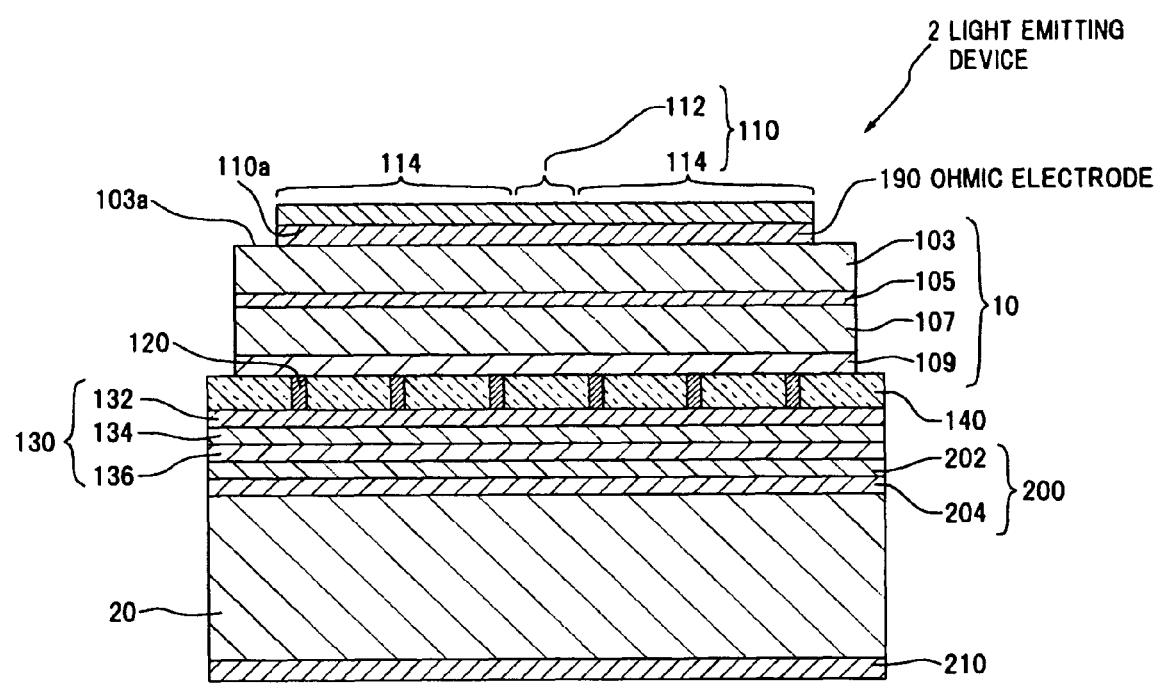
FIG. 23 is a schematic longitudinal sectional view of a light emitting device in a comparative example.

FIG. 23 is a schematic longitudinal cross section of the light emitting device in the comparative example.

In the light emitting device 2 in the comparative example, an ohmic electrode 190 which is in contact with an n-type cladding layer 103 was provided right under the surface center electrode part 110 instead of the transmitting layer 142. In addition, no light reflecting part was provided right under the narrow electrode, and a current feeding part was provided on the entire surface. Other structure is similar to the light emitting device in the Example.

Similarly to the Example, the light emitting device 2 in the comparative example was mounted on a TO-46 stem, and sealed with resin. Thereafter, the characteristics of the light emitting device 2 in the comparative example were evaluated. The emission power output was 1.4 mW when an electric current of 2 A was supplied to the light emitting device in the comparative example although the forward voltage was lower than 2.4V of the light emitting device in the Example. Namely, the emission power output of the light emitting device 2 in the comparative example was around two-thirds (⅔) of the emission power output of the light emitting device in the Example. It is assumed that this result was caused by a large light absorption loss in the surface center electrode part and a narrow part in the light emitting device 2 in the comparative example. Namely, the predominance of the light emitting device 1 in the Example to the light emitting device 2 in the comparative example was evidenced.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A light emitting device, comprising:
    a semiconductor multilayer structure including a first semiconductor layer of a first conductivity type, a second semiconductor layer of a second conductivity type different from the first conductivity type, and an active layer sandwiched between the first semiconductor layer and the second semiconductor layer;
    a narrow electrode including a current feeding part provided on a part of the first semiconductor layer for supplying an electric current from outside to the semiconductor multilayer structure, and a light reflecting part provided adjacent to the current feeding part for reflecting a light emitted from the active layer; and a surface center electrode part electrically connected to the narrow electrode, and provided above the first semiconductor layer via a transmitting layer for transmitting the light.

2. The light emitting device according to claim 1, wherein the surface center electrode part reflects the light at an interface between the transmitting layer and the surface center electrode part.

3. The light emitting device according to claim 2, wherein the current feeding part comprises a metal layer in ohmic-contact with a part of the semiconductor multilayer structure, and a narrow electrode metal layer provided on the metal layer at an opposite side of a part of the semiconductor multilayer structure.

4. The light emitting device according to claim 3, wherein the light reflecting part comprises a transmitting part comprising a resistivity higher than a resistivity of the current feeding part and the narrow electrode metal layer, and the light reflecting part reflects the light emitted from the active layer at an interface between the transmitting part and the narrow electrode metal layer.

5. The light emitting device according to claim 4 further comprising:
   a supporting substrate including a reflecting layer for reflecting the light emitted from the active layer;
   a transparent layer provided between the reflecting layer and the semiconductor multilayer structure; and
   a contact part provided by filling a region passing through a part of the transparent layer,
   wherein the semiconductor multilayer structure is supported by the supporting substrate via the transparent layer, and
   wherein the contact part electrically connects the semiconductor multilayer structure with the reflecting layer.

6. The light emitting device according to claim 5, wherein the surface center electrode part comprises a pad to which a wire is connected, and a linear electrode connected to the pad and extending along a horizontal direction of the active layer, and the linear electrode comprises a width greater than a width of the narrow electrode.

7. The light emitting device according to claim 6, wherein the transmitting layer and the transmitting part comprise an insulating material for transmitting the light.

8. The light emitting device according to claim 6, wherein the transmitting layer and the transmitting part comprise a conductive material for transmitting the light.

9. The light emitting device according to claim 6, wherein the transmitting layer and the transmitting part comprise a semiconductor material for transmitting the light.

* * * * *